United States Patent
Murota

(10) Patent No.: US 6,811,952 B2
(45) Date of Patent: Nov. 2, 2004

(54) PROCESS FOR PHOTOPOLYMERIZATION OF PHOTOSENSITIVE LITHOGRAPHIC PRINTING PLATE

(75) Inventor: Yasubumi Murota, Shizuoka (JP)

(73) Assignee: Fuji Photo Film Co., Ltd., Minami Ashigara (JP)

( * ) Notice: Subject to any disclaimer, the term of this patent is extended or adjusted under 35 U.S.C. 154(b) by 0 days.

(21) Appl. No.: 10/188,976

(22) Filed: Jul. 5, 2002

(65) Prior Publication Data

US 2003/0162130 A1 Aug. 28, 2003

(30) Foreign Application Priority Data

Jul. 5, 2001 (JP) .......................... P.2001-204824

(51) Int. Cl.⁷ ........................ G03F 7/004; G03F 7/30
(52) U.S. Cl. .................... 430/302; 430/281.1; 430/309; 430/434; 430/435; 430/494
(58) Field of Search ............................. 430/435, 270.1, 430/281.1, 286.1, 287.1, 288.1, 302, 309, 401, 434, 494, 331, 493

(56) References Cited

U.S. PATENT DOCUMENTS

| | | | |
|---|---|---|---|
| 4,098,712 A | | 7/1978 | Ikeda et al. |
| 4,147,552 A | * | 4/1979 | Specht et al. ............... 430/195 |
| 4,518,666 A | | 5/1985 | Quinn et al. |
| 5,019,482 A | | 5/1991 | Ai et al. |
| 5,922,522 A | | 7/1999 | Barr et al. |
| 5,942,372 A | * | 8/1999 | West et al. ............... 430/281.1 |
| 6,423,471 B1 | * | 7/2002 | Sorori et al. ............. 430/281.1 |
| 6,511,790 B2 | * | 1/2003 | Takamiya ................... 430/302 |
| 6,558,869 B1 | * | 5/2003 | McCullough et al. .... 430/270.1 |
| 2002/0155382 A1 | * | 10/2002 | Kondo et al. ............. 430/271.1 |
| 2003/0118951 A1 | * | 6/2003 | Nagase et al. .............. 430/331 |
| 2003/0143487 A1 | * | 7/2003 | Kondo et al. ............... 430/302 |
| 2003/0190554 A1 | * | 10/2003 | Kunita ..................... 430/285.1 |
| 2003/0211420 A1 | * | 11/2003 | Oshima ................... 430/278.1 |

FOREIGN PATENT DOCUMENTS

| | | | |
|---|---|---|---|
| EP | 0 304 136 A2 | 2/1989 | |
| EP | 0 704 764 A1 | 4/1996 | |
| EP | 0 730 201 A1 | 9/1996 | |
| EP | 0 949 540 A1 | 10/1999 | |
| EP | 1 070 990 A1 | 1/2001 | |
| EP | 1 273 972 A1 * | 1/2003 | ............. G03F/7/32 |
| JP | 60 263 147 A | 12/1985 | |
| JP | 10-204085 A | 8/1988 | |
| JP | 6-192309 A | 7/1994 | |
| JP | 9-268185 A | 10/1997 | |

* cited by examiner

*Primary Examiner*—Barbara Gilliam
(74) *Attorney, Agent, or Firm*—Burns, Doane, Swecker & Mathis, L.L.P.

(57) ABSTRACT

A photopolymerization process is disclosed, which comprises exposing a photosensitive lithographic printing plate containing at least one of sensitizing dyes represented by the following general formula (I) to laser beam having a wavelength of not greater than 450 nm:

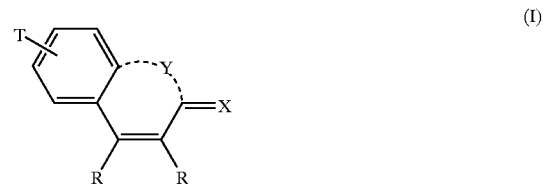

(I)

wherein T represents OR, SR, N(R)₂ or SO₂R and at least one T is present in the ortho or para position of the vinyl group, with the proviso that when the site at which Y is connected to the phenyl ring is an oxygen atom, sulfur atom or nitrogen atom, T may not be present; X represents an oxygen atom, sulfur atom or NR; Y represents a nonmetallic atom group which forms a ring with the adjacent carbon atoms; and R's each represent a hydrogen atom or nonmetallic atom group and may be connected to each other.

4 Claims, No Drawings

PROCESS FOR PHOTOPOLYMERIZATION OF PHOTOSENSITIVE LITHOGRAPHIC PRINTING PLATE

FIELD OF THE INVENTION

The present invention relates to a photopolymerization process involving the exposure of a photosensitive lithographic printing plate containing a specific dye to laser beam having a wavelength of not greater than 450 nm and a plate-making process involving the development of the photosensitive lithographic printing plate with a specific developer. More particularly, the present invention relates to a process for the production of a lithographic printing plate which gives a high productivity, provides a very contrast image with little printing stain due to optical fog and enables remarkable reduction of development tailings.

BACKGROUND OF THE INVENTION

As a lithographic printing plate there has heretofore been widely used a PS plate comprising an ink-receptive photosensitive resin layer provided on a water-receptive support. An ordinary plate-making process for producing such a PS plate comprises subjecting a photosensitive material to mask exposure (areal exposure) via a lithographic film, and then dissolving the non-image area away to obtain a desired printing plate.

In recent years, a digitization technique involving electronic processing, storage and outputting of image data using computer has been widely spread. Various new image outputting systems corresponding to the digitization technique have been put to practical use. As a result, a computer-to-plate (CTP) has been desired which comprises scanning light beam having a high directionality such as laser beam according to digitized image data to directly produce a printing plate without using lithographic film. It has been an important technical assignment to obtain a printing plate precursor adapted for this CTP technique.

With regard to conventional CTP system involving the use of long wavelength visible light source such as Ar laser (488 nm) and FD-YAG laser (532 nm) as a light source, it has been required to write data at a higher rate for the purpose of enhancing the productivity at the plate-making step. However, this demand has never been met because the output of the light source is not sufficiently high and the sensitivity of the photosensitive material is not sufficiently high.

Examples of such a photosensitive lithographic printing plate include a photosensitive lithographic printing plate comprising an initiation system formed by titanocene and coumarine in combination as disclosed in Japanese Patent (Application) Laid-Open No. 1997-268185, Japanese Patent Laid-Open No. 1994-192309 and Japanese Patent Laid-Open No. 1998-204085. Such a photosensitive material needs to be handled in a very dark room from the stand point of photosensitive properties. Such a photosensitive lithographic printing plate has been desired to have improvements in this respect, too.

In recent years, on the other hand, a semiconductor laser capable of continuously oscillating in a wavelength range of from 350 nm to 450 nm (violet LD) has been put to practical use with an InGaN-based material. A scanning exposure system comprising such a short wavelength light source is advantageous in that such a semiconductor laser can be produced at a reduced cost from the structural standpoint of view, making it possible to build an economical system. This system also allows the use of a photosensitive material sensitive to short wavelength which can be processed under a brighter safelight as compared with the conventional system involving the use of ED-YAG or Ar laser. When an inner drum type exposing machine, which is most ordinary, is used, the image drawing rate depends on the rotary speed of the inner mirror from the standpoint of the structure of the exposing machine. On the other hand, when the violet LD is used, the image drawing rate can be raised as compared with the conventional system involving the use of Ar laser (488 nm) or FD-YAG laser (532 nm) because the rotary speed of the inner mirror can be raised.

Under these circumstances, it has been keenly desired in the art to provide a lithographic printing plate precursor adapted for CTP system comprising a semiconductor laser having a wavelength as relatively short as from 350 nm to 450 nm.

An initiation system formed by a specific dye and a titanocene compound in combination has been heretofore known as an initiation system having a relatively high sensitivity. Japanese Patent Laid-Open No. 1997-80750 discloses a combination of a styryl-based dye and titanocene. Japanese Patent Laid-Open No. 1998-101719 discloses a combination of a dye having a 5-membered heterocyclic acidic nucleus and titanocene. It is certain that these initiation systems have a high sensitivity. However, the sensitivity of these initiation systems is not sufficiently high. Further, when laser beam having a wavelength of not greater than 450 nm is used, these initiation system cannot exhibit a practically sufficient sensitivity. Thus, these initiation systems are not adapted for short wavelength light source. There are no suggestions on adaptability to safelight.

These high sensitivity printing plates are disadvantageous in that when irradiated with a slight amount of lightbeam coming through the system during handling, storage or exposure the polymerizable components; in the photosensitive layer undergo polymerization to cure, causing so-called optical fog, i.e., print stain on the non-image area caused by the presence of material left unremoved even after development. In particular, when an inner drum type laser exposing machine is used to effect exposure, such a high sensitivity printing plate can easily undergo optical fog by reflected light (flare light). For example, when a negative-working plate, if used as a photosensitive material, is exposed to light through an image such as total solid image on one surface thereof, it undergoes weak fog sort of underdevelopment if the other surface is a non-image area. If the other surface (about 140° to 220° if the other surface is 180° with respect to light source) of the negative-working plate is halftone, dots are expanded, making it difficult to reproduce a minute image or highlighted area to disadvantage. It has thus been desired to overcome these difficulties.

Further, when these printing plates are subjected to development for a long period of time, unnecessary matters are accumulated, agglomerated and precipitated in the developer to produce development tailings that labilize development.

The provision of a photopolymerizable composition having a high sensitivity to light beam having a wavelength of from 350 nm to 450 nm from the aforementioned short wavelength laser is an important technique which has been demanded more and more in a wide industrial field other than CTP, e.g., laser imaging such as optical imaging, holography and color hard copy, production of electronic material such as photoresist and photosetting resin material such as ink, coating compound and adhesive.

SUMMARY OF THE INVENTION

An object of the present invention to provide a process for the photopolymerization of a high sensitivity photosensitive lithographic printing plate which enables the inhibition of optical fog and the reduction of development tailings resulting in the enhancement of development stability and a plate-making process involving the development of the photosensitive lithographic printing plate thus processed with a specific developer.

The foregoing object of the present invention will become apparent from the following detailed description and examples.

The present inventors made extensive studies of solution to these problems. As a result, it was found that the aforementioned object of the present invention is accomplished by the following photopolymerization process and plate-making process.

(1) A photopolymerization process which comprises exposing a photosensitive lithographic printing plate containing at least one of sensitizing dyes represented by the following general formula (I) to laser beam having a wavelength of not greater than 450 nm:

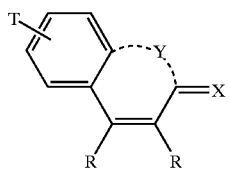
(I)

wherein T represents OR, SR, N(R)$_2$ or SO$_2$R and at least one T is present in the ortho or para position of the vinyl group, with the proviso that when the site at which Y is connected to the phenyl ring is an oxygen atom, sulfur atom or nitrogen atom, T may not be present; X represents an oxygen atom, sulfur atom or NR; Y represents a nonmetallic atom group which forms a ring with the adjacent carbon atoms; and R's each represent a hydrogen atom or nonmetallic atom group and may be connected to each other.

(2) The photopolymerization process according to Clause (1), wherein the sensitizing dye is at least one of sensitizing dyes represented by the following general formula (II):

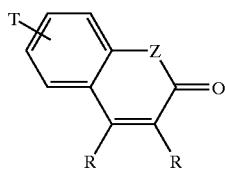
(II)

wherein T represents OR, SR, N(R)$_2$ or SO$_2$R and at least one T is present in the ortho or para position of the vinyl group, with the proviso that when the site at which Y is connected to the phenyl ring is an oxygen atom, sulfur atom or nitrogen atom, T may not be present; R's each represent a hydrogen atom or nonmetallic atom group and may be connected to each other; and Z represents an oxygen atom, sulfur atom or NR.

(3) A plate-making process for the production of a lithographic printing plate which comprises exposing a photosensitive lithographic printing plate prepared by the photopolymerization process defined in claim 1 or 2 to laser beam, and then developing the photosensitive lithographic printing plate thus exposed with a non-silicate-based developer containing a nonionic compound represented by the following general formula (III):

$$A\text{-}W \qquad (III)$$

wherein A represents a hydrophobic organic group log P of which is not smaller than 1.5 as determined in the form of A-H; and W represents a nonionic hydrophilic organic group log P of which falls below 1.0 as determined in the form of W-H.

(4) The plate-making process for the production of a lithographic printing plate according to Clause (3), wherein the developer contains a chelating agent for divalent metal.

(5) The plate-making process for the production of a lithographic printing plate according to Clause (3) or (4), wherein the developer exhibits a pH value of from 10.0 to 12.5 and an electrical conductivity of from 3 to 30 mS/cm.

In order to attain a sensitivity adapted for a high productivity system using a violet LD herein, it is effective to use a dye represented by the general formula (I), preferably a dye represented by the general formula (II). The reason why a dye having such a structure provides a high sensitivity is thought as follows.

In some detail, it is well known that a dye which has a prolonged excited life and thus can be difficultly deactivated exhibits a high sensitivity. It is thought that the dye having the structure defined herein is desirable in this respect. It is presumed that the violet LD emits a light beam having a short wavelength and gives a great excitation energy as compared with the conventional FD-YAG laser and Ar laser and thus is more subject to deactivation of dye.

Under these circumstances, the inventors found that the optical isomerization around the double bond in an excited dye is a cause of deactivation of dye. The inventors then found that the use of a dye having a structure that cannot undergo isomerization, i.e., dye represented by the general formula (I), preferably dye represented by the general formula (II) makes it possible to raise the sensitivity of the system. The present invention has thus been worked out.

The developer to be used in the plate-making process of the present invention has a low penetrating power as compared with the conventional developers and thus can dissolve the photosensitive material from the surface thereof without destroying the interior of the photoset area and the surface of the support. When the developer of the present invention is used, the developer doesn't penetrate the photoset area, preventing the image area from being completely peeled off the support and hence making it possible to develop the photosensitive material in complete accordance with the degree of curing of the photosensitive layer. Since the area which has been cured by a slight amount of light beam such as flare light has a low degree of curing while the image area which has been laser-exposed has a sufficiently high degree of curing, the use of the developer of the present invention makes it possible to completely develop the non-image area which has been closely cured by flare light without developing the laser-exposed area and hence form a definite image area. In other words, it was found that the use of the plate-making process of the present invention makes it possible to form a very contrast image using a very high sensitivity printing plate. The present invention has thus been worked out.

In particular, the developer composition was extensively studied. As a result, the use of a developer comprising a specific component made it possible to attain desired print stain resistance and press life at the same time without impairing image forming properties and dissolve the aforementioned compounds insoluble in the developer or stabilize it in dispersion for a long period of time, raising processing stability.

It is thought at present that the specific developer meets the following requirements as developer composition.

The first requirement is that the developer composition act extremely fairly for image forming properties (it exhibit a high developing properties at the unexposed area but a low penetrating power at the exposed area and successively dissolve the photosensitive layer from the surface thereof because the photosensitive layer has a non-swelling behavior as a dissolution behavior when dissolved).

The second requirement is that the developer can remove the photosensitive layer at the unexposed area entirely and reproduce the surface of the support as a water-wettable surface which is not subject to print stain.

The third requirement is that the developer comprise a nonionic compound of the general formula (I) having a hydrophilic site for interacting with the aforementioned compounds insoluble in the developer and a hydrophobic site for stabilizing these insoluble compounds in dispersion to disperse or solubilize these insoluble compounds in a stable manner The fourth requirement is that the developer has a low salt concentration to prevent salting or drop of development rate (it be a non-silicate-based developer and have a low pH value as compared with the conventional alkaline developers)

The fifth requirement is that the developer contain a chelating agent for removing divalent metal ions such as Ca ion contained in water which can be a labilizing factor during development.

With regard to the first and second requirements, the characteristics of the components of the photosensitive layer, too, are important factors. In particular, in the case of photopolymerizable lithographic printing plate, the developer is not restricted by the components of the photosensitive layer. It in the state-of-the-art knowledge that it is important to lower the acid value of the photosensitive layer below that of the conventional photosensitive layers from the standpoint of synergistic effect with the developer of the present invention.

The high sensitivity photosensitive lithographic printing plate of the present invention which is little subject to photographic fog and gives a reduced amount of developer grounds to improve stability in development and the process for the production thereof will be further described hereinafter.

[Photosensitive Lithographic Printing Plate]

The photosensitive lithographic printing plate to be used herein will be described.

[Photosensitive Layer]

Among the layers constituting the photosensitive lithographic printing plate, the photosensitive layer of the photosensitive lithographic printing plate to be used herein will be described.

The photosensitive layer of the photosensitive lithographic printing plate to be used herein is not specifically limited but is preferably a laser-drawable negative-working photopolymerizable photosensitive layer.

The main components of the photopolymerizable photosensitive layer are as follows.

a) Photopolymerization initiation system;
b) Compound having an addition-polymerizable ethylenically unsaturated double bond; and
c) High molecular polymer soluble in or swelled with an alkaline aqueous solution The photopolymerizable photosensitive layer may comprise various compounds such as colorant, plasticizer and heat polymerization initiator incorporated therein as necessary.

a) Photopolymerization Initiation System

The photopolymerization initiation system of the present invention is formed by a sensitizing dye having a specific structure and known various photopolymerization initiators in combination. These components will be successively described hereinafter.

The sensitizing dye to be used herein has a structure represented by the aforementioned general formula (I), preferably the aforementioned general formula (II). Among these dyes, those having a main absorption wavelength of not greater than 500 nm are not sensitive to light having a long wavelength and thus can be handled under a relatively bright yellow lamp to advantage in particular.

The sensitizing dyes having structures represented by the general formulae (I) and (II) will be further described hereinafter.

In the aforementioned general formula (I), T represents OR, SR, N(R)$_2$ or SO$_2$R. At least one T is present in the ortho or para position of the vinyl group, with the proviso that if the site at which Y is connected to the phenyl ring is an oxygen atom, sulfur atom or nitrogen atom, T may not be present.

a plurality of T's may be present. The phenyl ring having T may have substituents other than T.

X represents an oxygen atom, sulfur atom or NR.

Y represents a nonmetallic atom group which forms a ring with the adjacent carbon atoms. R's each represent a hydrogen atom or nonmetallic atom group and may be connected to each other.

R's in N (R)$_2$ each may be connected to the phenyl ring.

Y represents a nonmetallic atom group required to form a ring with the adjacent carbon atoms. Y may be any substituent which can suppress isomerization between α-carbon and β-carbon to 20% or less by the ring formation in molecule or the like. Specific examples of the ring thus formed include cycloalkane, cycloalkene, aromatic ring, and heteroaryl ring. These rings each may contain hetero atoms in its chain.

R's each independently represent a hydrogen atom or nonmetallic atom group. Specific preferred examples of such a substituent include hydrogen atom, alkyl group, substituted alkyl group, halogen atom (—F, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamiono group, ureido group, N'-alkylureido group, N',N'-dialkylureide group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N- aryloxycarbonylamino group, N-aryl-N-alkoxycarbonylamino group, N-aryl-N-aryloxycarbonylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo group (—SO₃H) and conjugated base thereof (hereinafter referred to as "sulfonato group"), alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, phosphono group (—PO₃H₂) and conjugated base thereof (hereinafter referred to as "phosphonato group"), dialkylphosphono group (—PO₃(alkyl)₂), diarylphosphono group (—PO₃(aryl)₂), alkylarylphosphono group (—PO₃(alkyl) (aryl)) monoalkylphosphono group (—PO₃H(alkyl)) and conjugated base (hereinafter referred to as "alkylphosphonato group"), monoarylphosphono group (—PO₃H(aryl)) and conjugated base (hereinafter referred to as "arylphosphonato group"), phosphonoxy group (—OP₃H₂) and conjugated base (hereinafter referred to as "phosphonatoxy group"), dialkylphosphonoxy group (—OPO₃(alkyl)₂), diarylphosphonoxy group (—OPO₃(aryl)₂), alkylarylphosphonoxy group —OPO₃(alkyl) (aryl)), monoalkylphosphonoxy group —OPO₃H (alkyl)) and conjugated base (hereinafter referred to as "alkylphosphonatoxy group"), monoarylphosphonoxy group —OPO₃H (aryl)) and conjugated base (hereinafter referred to as "arylphosphonatoxy group"), cyano group, nitro group, aryl group, heteroaryl group, alkenyl group, and alkynyl group.

Preferred examples of the alkyl group among these substituents include $C_1$–$C_{20}$ straight-chain, branched and cyclic alkyl groups. Specific examples of these alkyl groups include methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group.

Preferred among these alkyl groups are $C_1$–$C_{12}$ straight-chain alkyl group, $C_3$–$C_{12}$ branched alkyl group, and $C_5$–$C_{10}$ cyclic alkyl group.

On the other hand, the alkylene group in the substituted alkyl group may be a divalent organic residue obtained by removing any one of the hydrogen atoms on the aforementioned $C_1$–$C_{20}$ alkyl group, preferably $C_1$–$C_{12}$ straight-chain alkylene group, $C_3$–$C_{12}$ branched alkylene group or $C_5$–$C_{10}$ cyclic alkylene group.

The substituents on the substituted alkyl group are arbitrary. Specific preferred examples of the substituted alkyl group include chloromethyl group, bromomethyl group, 2-chloroethyl group, trifluoromethyl group, methoxymethyl group, methoxyethoxyethyl group, allyloxymethyl group, phenoxymethyl group, methylthiomethyl group, tollylthiomethyl group, ethylaminoethyl group, diethylaminopropyl group, morpholinopropoyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carboxypropyl group, methoxycarbonylethyl group, allyloxycarbonylbutyl group, chlorophenoxycarbonylmethyl group, carbamaoylmethyl group, N-methylcarbamoylethyl group, N,N-dipropylcarbamoylmethyl group, N-(methoxyphenyl) carbamoylethyl group, N-methyl-N-(sulfophenyl) carbamoylmethyl group, sulfobutyl group, sulfonatobutyl group, sulfamoylbutyl group, N-ethylsulfamoylmethyl group, N,N-dipropylsulfamoylpropyl group, N-tollylsulfamoylpropyl group, N-methyl-N-(phosphonophenyl)sulfamoyloctyl group, phosphonobutyl group, phosphonatohexyl group, diethylphosphonobutyl group, diphenylphosphonopropoyl group, methylphosphonobutyl group, methylphosphonatobutyl group, tollylphosphonohexyl group, tollylphosphonatohexyl group, phosphonoxypropyl group, phosphonatoxybutyl group, benzyl group, phenethyl group, α-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propinyl group, 2-butynyl group, and 3-butynyl group.

Examples of the aryl group in these substituents include cyclic aryl group formed by condensing from 1 to 3 benzene rings, and cyclic aryl group formed by condensing a benzene ring with a 5-membered unsaturated ring. Specific examples of these aryl groups include phenyl group, naphthyl group, anthryl group, phenanthryl group, indenyl group, acenaphthenyl group, and fluorenyl group. Preferred among these aryl groups are phenyl group and naphthyl group.

Specific examples of the substituted aryl group employable herein include those having a nonmetallic atom group except hydrogen as a substituent on the ring-forming carbon atom of the aforementioned aryl group.

Specific examples of the substituted aryl group include biphenyl group, tollyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tollylthiophenyl group, ethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl) carbamoylphenyl group, N-methyl-N-(sulfophenyl) carbamoylphenyl group, sulfophenyl group, sulfonatophenyl group, sulfamoylphenyl group, N-ethylsulfamoylphenyl group, N,N-dipropylsulfamoylphenyl group, N-tollylsulfamoylphenyl group, N-methyl-N-(phosphonophenyl)sulfamoylphenyl group, phosphonophenyl group, phosphonatophenyl group, diethylphosphonophenyl group, diphenylphosphonophenyl group, methylphosphonophenyl group, methylphosphonatophenyl group, tollylphosphonophenyl group, tollylphosphonatophenyl group, allyl group, 1-propenylmethyl group, 2-butenyl group, 2-methylallylphenyl group, 2-methylpropenylphenyl group, 2-propenylphenyl group, 2-butynylphenyl group, and 3-butynylphenyl group.

As the heteroaryl group there may be used a monocyclic orpolycyclic aromatic group containing at least one of nitrogen, oxygen and sulfur, preferably 5- or 6-membered aromatic substituent such as furan, pyrrole and pyridine.

Examples of the alkenyl group include vinyl group, 1-propenyl group, 1-butenyl group, cinnamyl group, and 2-chloro-1-ethenyl group. Examples of the alkynyl group include ethynyl group, 1-propinyl group, 1-butynyl group, and trimethylsilylethynyl group.

Examples of $G_1$ in the acyl group ($G_1CO—$) include hydrogen, and the aforementioned alkyl group and aryl group. Preferred among these substituents include halogen atom (—F, —Br, —Cl, —I), alkoxy group, aryloxy group, alkylthio group, arylthio group, N-alkylamino group, N,N-dialkylamino group, acyloxy group, N-alkylcarbamoyloxy group, N-arylcarbamoyloxy group, acylamino group, formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N-alkyl-N-arylcarbamoyl group, sulfo group, sulfonato group, sulfamoyl group, N-alkylsulfamoyl group, N,N-dialkylsulfamoyl group, N-arylsulfamoyl group, N-alkyl-N-arylsulfamoyl group, phosphono group, phosphonato group, dialkylphosphono group, diarylphosphono group, monoalkylphosphono group, alkylphosphonato group, monoarylphosphono group, arylphosphonato group, phosphonoxy group, phosphonatoxy group, aryl group, and alkenyl group.

R described above is predetermined from various practical standpoints of view besides properties such as photosensitivity, wavelength to which the lithographic printing plate is sensitive and stability. R is predetermined, e.g., from the standpoint of improvement of compatibility in the composition system and prevention of crystallization, from the standpoint of development conditions such as solubility and dispersibility in developer and difficulty in crystallization in developer and from the economical standpoint of view such as price of starting materials, ease of synthesis and ease of purification.

From this standpoint of view, particularly preferred examples of the substituents include hydrogen atom, halogen atom (—F, —Br, —Cl, —I), $C_1$–$C_6$ lower alkyl group (e.g., methyl group, ethyl group, propyl group, isopropyl group, allyl group, 2-methylpropenyl group), and alkyl-substituted aminoalkylene group (Examples of the alkyl group include $C_1$–$C_6$ straight-chain or branched alkyl-substituted alkyl group, and $C_5$–$C_7$ cyclic alkyl group. Examples of the alkylene group include $C_1$–$C_3$ mono-, di- and trimethylene group).

Specific examples of the aryl group include phenyl group, naphthyl group, anthryl group, phenanthryl group, indenyl group, acenaphthenyl group, and fluorenyl group. Specific examples of the substituted aryl group include biphenyl group, tollyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tollylthiophenyl group, ethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl) carbamoylphenyl group, N-methyl-N-(sulfophenyl) carbamoylphenyl group, sulfophenyl group, sulfonatophenyl group, sulfamoylphenyl group, N-ethylsulfamoylphenyl group, N,N-dipropylsulfamoylphenyl group, N-tollylsulfamoylphenyl group, N-methyl-N-(phosphonophenyl)sulfamoylphenyl group, phosphonophenyl group, phosphonatophenyl group, diethylphosphonophenyl group, diphenylphosphonophenyl group, methylphosphonophenyl group, methylphosphonatophenyl group, tollylphosphonophenyl group, tollylphosphonatophenyl group, allyl group, 1-propenylmethyl group, 2-butenyl group, 2-methylallylphenyl group, 2-methylpropenylphenyl group, 2-propynylphenyl group, 2-butynylphenyl group, and 3-butynylphenyl group.

As the heteroaryl group there may be used a monocyclic or polycyclic aromatic group containing at least one of nitrogen atom, oxygen atom and sulfur atom, preferably a 5- or 6-membered aromatic substituent such as furan, pyrrole and pyridine.

Examples of the substituted heteroaryl group employable herein include a monovalent nonmetallic atom group. Particularly preferred examples of heteroaryl group include thiophene, thiathrene, furan, pyran, isobenzofuran, chromene, xanthene, phenoxazine, pyrrole, pyrazole, isothiazole, isoxazole, pyrazine, pyrimidine, pyridazine, indolidine, isoindolidine, indole, indazole, purine, quinolizine, isoquinoline, phthalazine, naphthyridine, quinazoline, sinoline, pteridine, carbazole, carboline, phenanthrine, acridine, perimidine, phenanthroline, phenalzadine, and furazan. These heteroaryl groups may be further subjected to benzo condensation or may have substituents.

In the general formula (I), R's may be connected to each other to form a ring.

The ring formed by connecting the substituents R to each other may be any substituent which can suppress isomerization between α-carbon and β-carbon to 20% or less by the ring formation in molecule or the like. Specific examples of the ring include cycloalkane, cycloalkene, aromatic ring, and heteroaryl ring. These rings each may contain heteroatoms in its chain.

In the general formula (II), T represents OR, SR, $N(R)_2$ or $SO_2R$. At least one T is present in the ortho or para position of the vinyl group, with the proviso that if the site at which Y is connected to the phenyl ring is an oxygen atom, sulfur atom or nitrogen atom, T may not be present.

A plurality of T's may be present. Substituents other than T may be present on the phenyl ring having T.

R's each represent a hydrogen atom or nonmetallic atom group and may be connected to each other.

Z represents an oxygen atom, sulfur atom or NR.

T and R are as defined in the general formula (I).

Specific examples of the sensitizing dye of the present invention include those represented by the chemical structural formulae (D-1) to (D-42). As the sensitizing dye there may be preferably used any sensitizing dye which satisfies the aforementioned structural requirements. The present invention is not limited to the following chemical structural formulae.

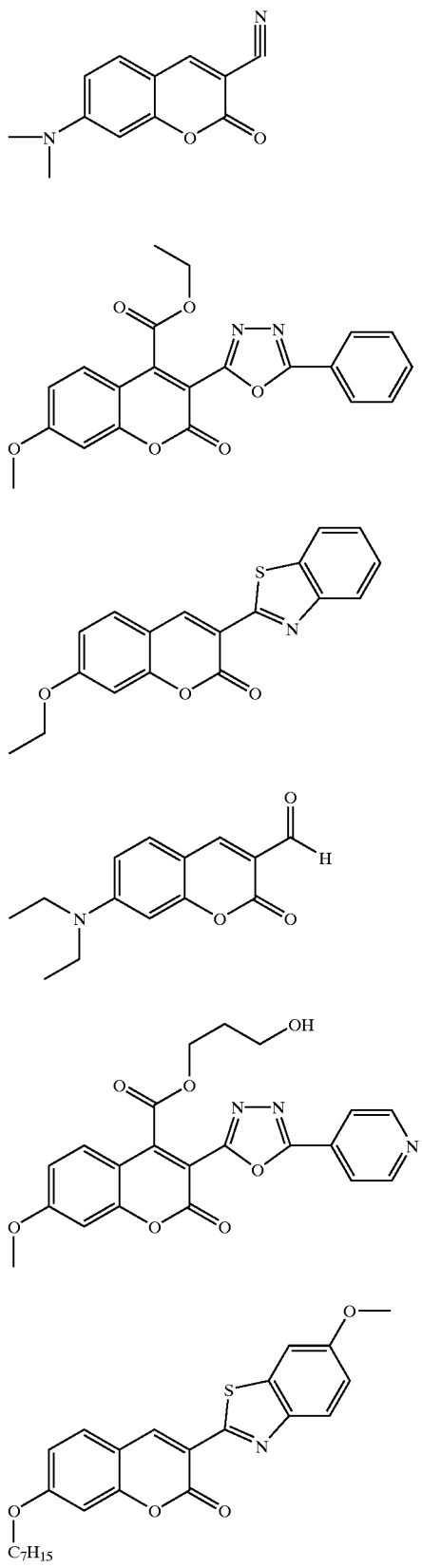
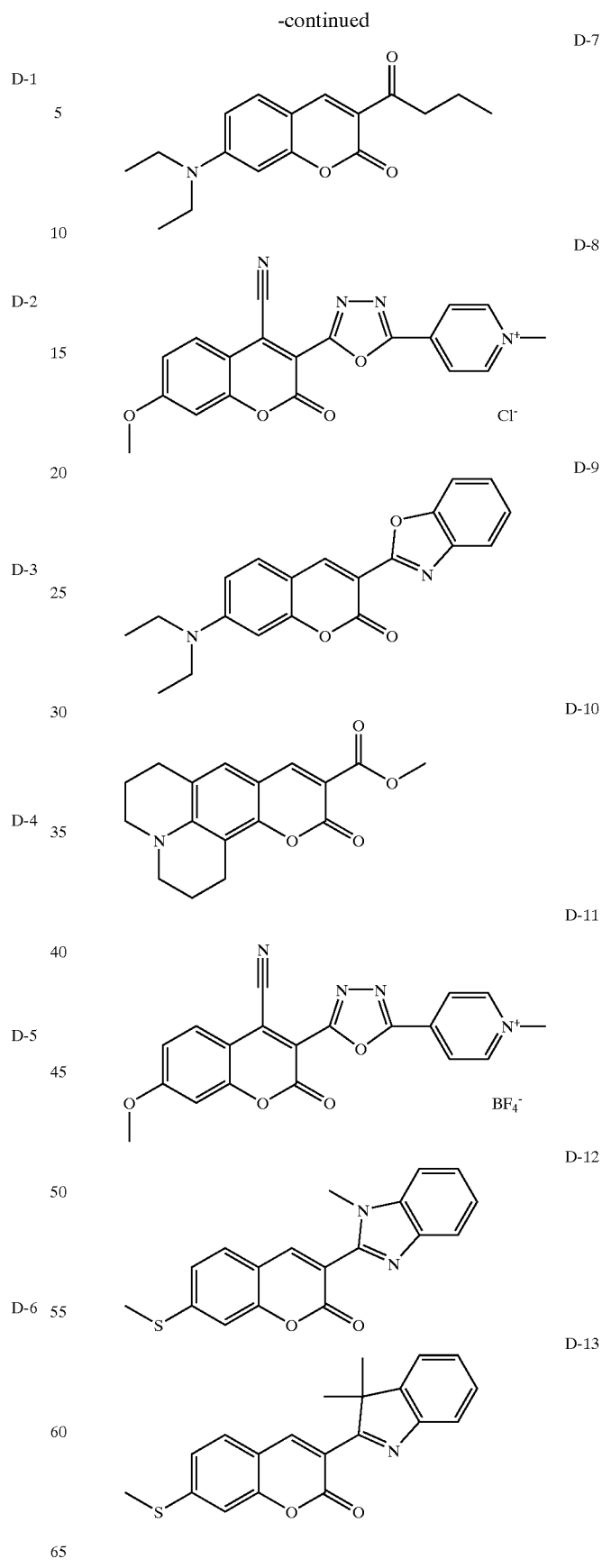

-continued
D-14
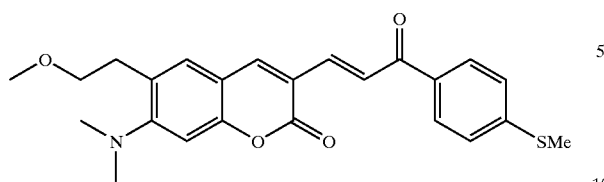
D-15
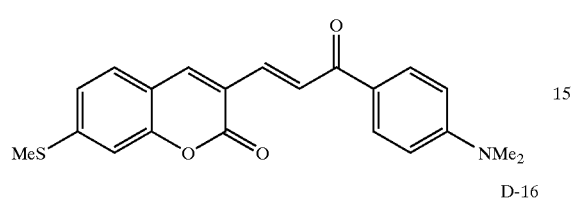
D-16
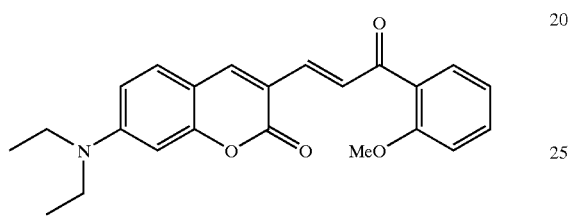
D-17
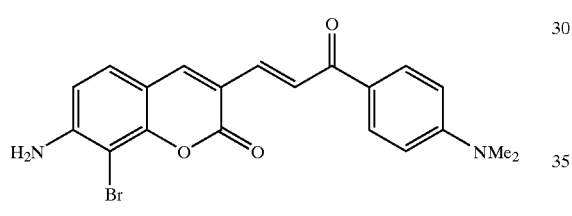
D-18
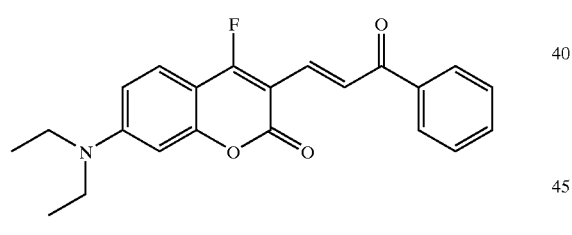
D-19
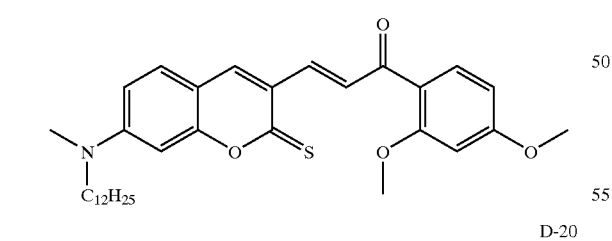
D-20
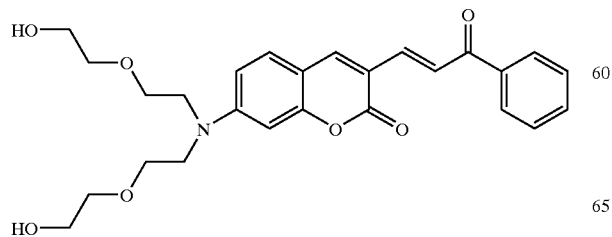
-continued
D-21
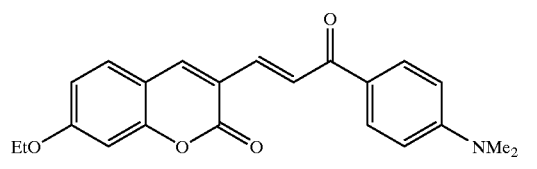
D-22
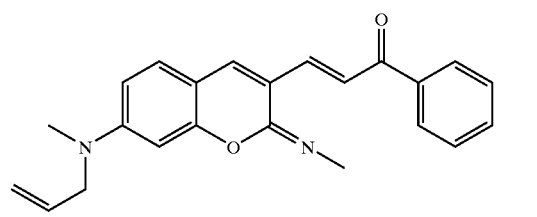
D-23
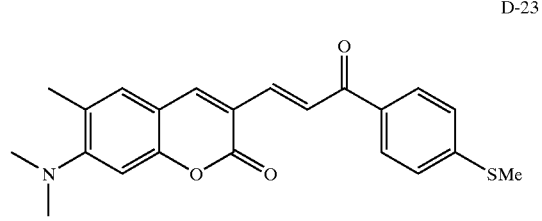
D-24
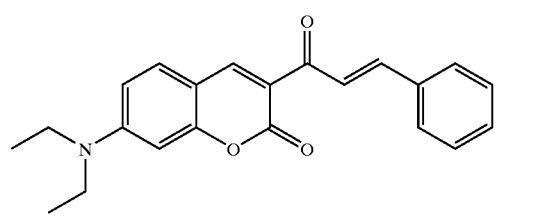
D-25
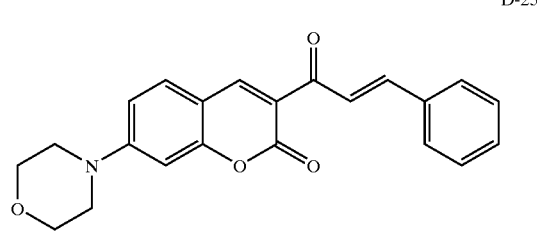
D-26
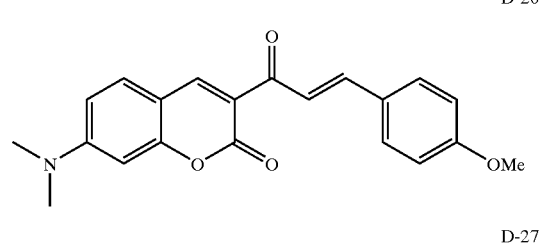
D-27
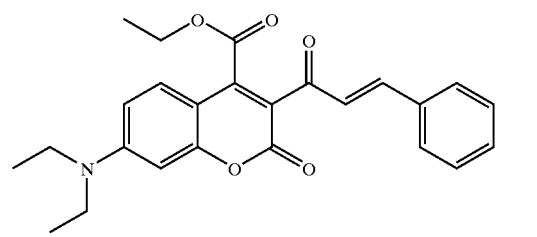

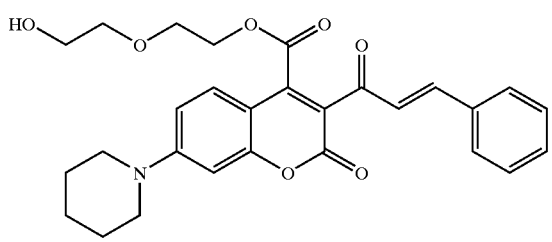

D-28

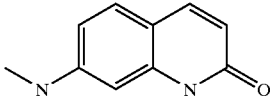

D-36

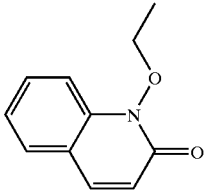

D-29

D-37

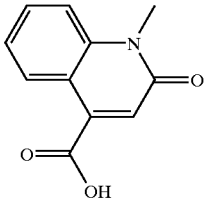

D-30

D-38

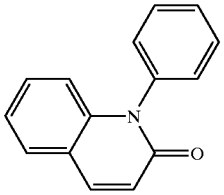

D-31

D-39

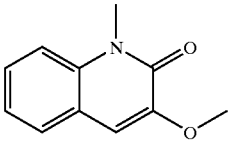

D-32

D-40

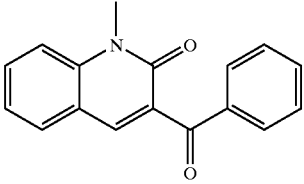

D-33

D-41

D-34

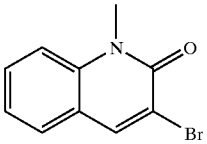

D-35

D-42

The sensitizing dyes of the present invention represented by the general formulae (I) and (II) can be easily synthesized by any known synthesis method or related synthesis method. Specific examples of such a synthesis method will be given below.

The sensitizing dye represented by the general formula (I) can be synthesized by a method described in "Synthesis", EN, 1, 1997, pp. 87–90, U.S. Pat. No. 4,147,552, Japanese Patent (Application) Laid-Open No. 192309/1994, British Patent No. 867592, DE 1098125, Japanese Patent Publication No. 7488/1976, Japanese Patent (Application) Laid-Open No. 204085/1998, Jikken Kagaku Koza (Institute of Experimental Chemistry), 4th edition, page 54 (The Chemical Society of Japan, 1992), etc.

The sensitizing dye of the present invention can be further subjected to various chemical modifications for improving the properties of the photosensitive layer. For example, by connecting the sensitizing dye to an addition-polymerizable compound structure (e.g., acryloyl group, methacryloyl group) covalently, ionically, with a hydrogen bond or otherwise, the strength of the exposed film can be enhanced or unnecessary precipitation of dye from the film which has been exposed can be inhibited. Further, by connecting the sensitizing dye to the titanocene compound described later or other radical-generating parts (e.g., reduction-decomposable site such as halogenated alkyl, onium, peroxide and bimidazole, oxidation-cleavable site such as borate, amine, trimethylsilyl methyl, carboxymethyl, carbonyl and imine), the photosensitivity can be remarkably enhanced particularly when the initiation system is in a low concentration. For the accomplishment of the aim of enhancing the adaptability to processing with an (alkaline) aqueous developer, which is a preferred embodiment of use of the present photosensitive layer, the incorporation of a hydrophilic site (acid group or polar group such as carboxyl group and ester thereof, sulfonic acid group and ester thereof, and ethylene oxide group) is effective. In particular, an ester-based hydrophilic group has a relatively hydrophobic structure in the photosensitive layer and thus exhibits an excellent compatibility. The ester-based hydrophilic group undergoes hydrolysis in the developer to produce an acid group that enhances the hydrophilicity thereof.

The sensitizing dye of the present invention may further comprise proper substituents incorporated therein to enhance the compatibility in the photosensitive layer and inhibit crystallization in the photosensitive layer. For example, in a certain photosensitive system, an unsaturated bond such as aryl group and allyl group can be very effective for the enhancement of compatibility. Further, the incorporation of a branched alkyl structure or other methods can cause the incorporation of steric hindrance between dye π-planes, making it possible to remarkably inhibit crystallization. Moreover, the incorporation of a phosphonic acid group, epoxy group, trialkoxysilyl group or the like makes it possible to enhance the adhesion of the sensitizing dye to an inorganic material such as metal and metal oxide. Further, the sensitizing dye can be subjected to polymerization or the like depending on the purpose.

The use of the sensitizing dye can be arbitrarily predetermined according to the design of properties of photosensitive material similarly to the addition-polymerizable compound described later. For example, two or more sensitizing dyes may be used in combination to enhance compatibility with the photosensitive layer. For the predetermination of sensitizing dye, the molar absorption coefficient of the sensitizing dye at an emission wavelength of the light source is an important factor besides the photosensitivity of the sensitizing dye. The use of a dye having a great molar absorption coefficient makes it possible to relatively reduce the amount of the dye to be added to advantage in economy and physical properties of photosensitive layer. The photosensitivity and definition of the photosensitive layer and the physical properties of the exposed film are greatly affected by the absorbance at the wavelength of the light source. Thus, the amount of the sensitizing dye to be added is properly predetermined taking into account these factors. Further, the effect of halation causes the deterioration of definition. However, for the aim of curing a film having a thickness as high as 5 μm or more, such a low absorbance is preferred to enhance the degree of curing. In a range where the absorbance is 3 or higher, the majority of light is absorbed on the surface of the photosensitive layer, preventing curing in deep site. For example, when such a sensitizing dye is incorporated in a printing plate, the resulting printing plate is insufficient in film strength and adhesion to substrate. For the incorporation in a lithographic printing plate which is used in a relatively thin film form, the amount of the sensitizing dye to be added is preferably predetermined such that the absorbance of the photosensitive layer falls within the range of from 0.1 to 1.5, preferably from 0.25 to 1. In the case where the sensitizing dye is incorporated in a lithographic printing plate, the amount of the sensitizing dye to be added is normally from 0.05 to 30 parts by weight, preferably from 0.1 to 20 parts by weight, more preferably from 0.2 to 10 parts by weight based on 100 parts by weight of the photosensitive layer components.

As the photopolymerization initiator to be incorporated in the photosensitive layer of the photosensitive lithographic printing plate of the present invention there may be properly used any of various photo-initiators known in patents, references, etc. or a combination (photo-initiation system) of two or more photo-initiators depending on the wavelength of the light source used.

Examples of the photopolymerization initiator employable herein include dye-amine composite initiation system (Japanese Patent Publication No. 20189/1969), hexaryl biimidazoles (Japanese Patent Publication No. 2528/1972, Japanese Patent Laid-Open No. 155292/1979, Japanese Patent Laid-Open No. 1984-140203, Japanese Patent Laid-Open No. 36354/1998, etc.), cyclic cis-α-dicarbonyl compounds (Japanese Patent Laid-Open No. 84183/1973, etc.), triazine compounds (Japanese Patent Laid-Open No. 151024/1979, etc.), organic peroxides (Japanese Patent Laid-Open No. 1504/1984, Japanese Patent Laid-Open No. 140203/1984, Japanese Patent Laid-Open No. 189340/1984, Japanese Patent Laid-Open No. 174203/1987, Japanese Patent Publication No. 1641/1987, U.S. Pat. No. 4,766,055, etc.), active halogen (Japanese Patent Laid-Open No. 358903/1988, Japanese Patent Laid-Open No. 63054/1990, etc.), borate compounds (Japanese Patent Laid-Open No. 143044/1987, Japanese Patent Laid-Open No. 229003/1989, Japanese Patent Laid-Open No. 188685/1997, Japanese Patent Laid-Open No. 188686/1997, Japanese Patent Laid-Open No. 188710/1997, etc.), and titanocene compounds (Japanese Patent Laid-Open No. 221110/1988, Japanese Patent Laid-Open No. 221958/1992, Japanese Patent Laid-Open No. 219756/1992, Japanese Patent Laid-Open No. 295061/1994, Japanese Patent Laid-Open No. 334897/1996, etc.).

The photopolymerization initiator to be used herein may further comprise an auxiliary such as amine compound and thiol compound incorporated there in as necessary. The incorporation of these hydrogen-providing compounds makes it possible to enhance photopolymerization initiating capacity.

The amount of the photopolymerization initiator to be used is from 0.05 to 100 parts by weight, preferably from 0.1 to 70 parts by weight, more preferably from 0.2 to 50 parts by weight based on 100 parts by weight of the ethylenically unsaturated compound.

b) Compound Having an Addition-Polymerizable Ethylenically Unsaturated Double Bond The compound having an addition-polymerizable ethylenically unsaturated double bond can be arbitrarily selected from compounds having at least one, preferably two or more terminal ethylenically unsaturated double bonds.

For example, compounds having a chemical form such as monomer, prepolymer, i.e., dimer, trimer and oligomer, mixture thereof and copolymer thereof may be used.

Examples of the monomer and copolymer thereof include an ester of unsaturated carboxylic acid (e.g., acrylic acid, methacrylic acid, itaconic acid, crotonic acid, isocrotonic acid, maleic acid) with aliphatic polyvalent alcohol compound, and an amide of an unsaturated carboxylic acid with an aliphatic polyvalent amine compound.

Specific examples of the ester of unsaturated carboxylic acid with aliphatic polyvalent alcohol compound include acrylic acid ester such as ethylene glycol diacrylate, triethylene glycol diacrylate, 1,3-butanediol diacrylate, tetramethylene glycol diacrylate, propylene glycol diacrylate, neopentyl glycol diacrylate, trimethylol propane triacrylate, trimethylol propane tri(acryloyloxypropyl) ether, trimethylolethane triacrylate, hexanediol diacrylate, 1,4-cyclohexanediol diacrylate, tetraethylene glycol diacrylate, pentaerythritol diacrylate, pentaetrythritol triacrylate, pentaerythritol tetraacrylate, dipentaerythritol diacrylate, dipentaerythritol pentaacrylate, dipentaerythritol hexaacrylate, sorbitol triacrylate, sorbitol tetraacrylate, sorbitol pentaacrylate, sorbitol hexaacrylate, tri(acryloyloxyethyl) isocyanurate and polyester acrylate oligomer, methacrylic acid ester such as tetramethylene glycol dimethacrylate, triethylene glycol dimethacrylate, neopentyl glycol dimethacrylate, trimethylolpropane trimethacrylate, trimethylolethane trimethacrylate, ethylene glycol dimethacrylate, 1,3-butanediol dimethacrylate, hexanediol dimethacrylate, pentaerythritol dimethacrylate, pentaerythritol trimethacrylate, pentaerythritol tetramethacrylate, dipentaerythritol dimethacrylate, dipentaerythritol dimethacrylate, dipentaerythritol hexamethacrylate, dipentaerythritol pentamethacrylate, sorbitol trimethacrylate, sorbitol tetramethacrylate, bis[p-(3-methacryloxy-2-hydroxypropoxy)phenyl] dimethylmethane and bis-[p-(methacryloxyethoxy)phenyl] dimethylmethane, itaconic acid ester such as ethylene glycol diitaconate, propylene glycol diitaconate, 1,3-butanediol diitaconate, 1,4-butanediol diitaconate, tetramethylene glycol diitaconate, pentaerythritol diitaconate and sorbitol tetraitaconate, crotonic acid ester such as ethylene glycol dicrotonate, tetramethylene glycol dicrotonate, pentaerythritol dicrotonate and sorbitol tetradicrotonate, isocrotonic acid ester such a ethylene glycol diisocrotonate, pentaerythritol diisocrotonate and sorbitol tetraisocrotonate, and maleic acid ester such as ethylene glycol dimalate, triethylene glycol dimalate, pentaerythritol dimalate and sorbitol tetramalate.

The previously described ester monomers may be used in admixture.

Specific examples of the amide of unsaturated carboxylic acid with aliphaticpolyvalent amine compound include methylene bisacrylamide, methylene bismethacrylamide, 1,6-hexamethylene bisacrylamide, 1,6-hexamethylene bismethacrylamide, diethylene triamine trisacrylamide, xylylene bisacrylamide, and xylylene bismethacrylamide.

Other examples of the ester include a vinylurethane compound containing two or more polymerizable vinyl groups per molecule obtained by adding to a polyisocyanate compound having two or more isocyanate groups per molecule a vinyl monomer having a hydroxyl group represented by the following general formula (A) described in Japanese Patent Publication No. 41708/1973:

$$CH_2=C(R^{21})COOCH_2CH(R^{22})OH \quad (A)$$

wherein $R^{21}$ and $R^{22}$ each represent H or $CH_3$.

Further, urethane acrylates described in Japanese Patent Laid-open No. 37193/1976 and Japanese Patent Publication No. 32293/1990, polyester acrylates described in Japanese Patent Laid-Open No. 64183/1973, Japanese Patent Publication No. 43191/1974 and Japanese Patent Publication No. 30490/1977, polyester acrylates described in Japanese Patent Publication No. 30490/1977, and polyfunctional acrylates or methacrylates such as epoxy acrylate obtained by the reaction of epoxy resin with (meth)acrylic acid. Further, those described as photosetting monomer and oligomer in Journal of Japan Adhesive Industry Association, vol. 20, No. 7, pp. 300–308, 1984 may be used. The amount of these esters to be used is from 5 to 70% by weight (hereinafter abbreviated as "%"), preferably from 10 to 50% based on the total amount of components.

c) High Molecular Polymer Soluble in or Wettable with an Alkaline Aqueous Solution The high molecular polymer soluble in or wettable with an alkaline aqueous solution to be incorporated in the photosensitive layer of the photosensitive lithographic printing plate of the present invention is not only used as a film-forming agent for the composition but also is selectively used depending on the purpose of the alkaline aqueous developer. An organic high molecular polymer can be subjected to aqueous development if it is water-soluble. Examples of such an organic high molecular polymer include addition polymers having a carboxylic acid group in its side chain such as methacrylic acid copolymer, acrylic acid copolymer, itaconic acid copolymer, crotonic acid copolymer, maleic acid copolymer and partially-esterified maleic acid copolymer described in Japanese Patent Laid-Open No. 44615/1984, Japanese Patent Publication No. 34327/1979, Japanese Patent Publication No. 12577/1983, Japanese Patent Publication No. 25957/1979, Japanese Patent Laid-Open No. 92723/1979, Japanese Patent Laid-Open No. 53836/1984 and Japanese Patent Laid-Open No. 71048/1984.

Similarly, acidic cellulose derivatives having a carboxylic acid group in its side chain may be used. Besides these high molecular polymers, those obtained by adding a cyclic acid anhydride to an addition polymer having a hydroxyl group are useful. Particularly preferred among these high molecular polymers are [benzyl (meth)acrylate/(meth)acrylic acid/ optionally other addition-polymerizable vinyl monomers] copolymer and [allyl (meth)acrylate/(meth)acrylic acid/ optionally other addition-polymerizable vinyl monomers] copolymer. Besides these high molecular polymers, polyvinyl pyrrolidone, polyethylene oxide, etc. are useful as water-soluble organic polymer. In order to enhance the strength of the cured film, an alcohol-soluble polyamide, a polyether of 2,2-bis-(4-hydroxyphenyl)-propane with epichlorohydrin, etc. can be used.

Further, polyurethane resins described in Japanese Patent Publication No. 120040/1995, Japanese Patent Publication No. 120041/1995, Japanese Patent Publication No. 120042/ 1995, Japanese Patent Publication No. 12424/1996, Japanese Patent Laid-Open No. 287944/1988, Japanese Patent Laid-Open No. 287947/1988, Japanese Patent Laid-Open No. 271741/1989 and Japanese Patent Laid-Open No. 352691/1999 are useful in the purpose of the present invention.

These high molecular polymers can comprise a radical reactive group incorporated therein in its side chain to enhance the strength of the cured film. Examples of the addition-polymerizable functional group include ethylenically unsaturated bond, amino group, and epoxy group. Examples of the functional group which can become a radical when irradiated with light beam include mercapto group, thiol group, halogen atom, triazine structure, and onium salt structure. Examples of the polar group include carboxyl group, and imide group. Particularly preferred examples of the addition-polymerizable functional group include ethylenically unsaturated bond such as acryl group, methacryl group, allyl group and styryl group. A functional group selected from the group consisting of amino group, hydroxyl group, phosphonic acid group, phosphoric acid group, carbamoyl group, isocyanate group, ureido group, ureylene group, sulfonic acid group, and ammonio group is useful.

In order to maintain the develop ability of the composition, the high molecular polymer of the present invention preferably has a proper molecular weight and acid value. In order to develop the composition with the previously described developer, a high molecular polymer having a weight-average molecular weight of from 5,000 to 300,000 and an acid value of from 0.2 to 5.0 meq/g is preferably used.

These organic high molecular polymers maybe incorporated in the total composition in an arbitrary amount. However, when the amount of the organic high molecular polymers exceeds 90% by weight, the resulting effect is not desirable from the standpoint of intensity of image formed. The amount of the organic high molecular polymers is preferably from 10% to 90%, more preferably from 30% to 80%. The weight ratio of photopolymerizable ethylenically unsaturated compound and organic high molecular polymer is preferably from 1/9 to 9/1, more preferably from 2/8 to 8/2, even more preferably from 3/7 to 7/3.

In the present invention, a small amount of a heat polymerization initiator is preferably added besides the aforementioned basic components to inhibit unnecessary heat polymerization of the polymerizable ethylenically unsaturated compound during the production or storage of the photosensitive composition for the photosensitive layer. Examples of the proper heat polymerization initiator employable herein include hydroquinone, p-methoxyphenol, di-t-butyl-p-cresol, pyrogallol, t-butyl catechol, benzoquinone, 4,4'-thiobis(3-methyl-6-t-butylphenol), 2,2'-methylenebis(4-methyl-6-t-butylphenol), cerous salt of N-nitrosophenylhydroxyamine, and aluminum salt of N-nitrosophenylhydroxylamine. The amount of the heat polymerization inhibitor to be added is preferably from about 0.01% to 5%. If necessary, in order to prevent the inhibition of polymerization by oxygen, a higher aliphatic acid derivative such as behenic acid and behenic acid amide or the like may be incorporated in the composition so that it is located on the surface of the photosensitive layer during the drying of the composition which has been spread. The amount of the higher aliphatic acid derivative to be added is preferably from about 0.5% to 10% based on the total composition.

For the purpose of coloring the photosensitive layer, the composition of the present invention may further comprise a colorant incorporated therein. Examples of the colorant include pigments such as phthalocyanine dye (C. I. Pigment Blue 15:3, 15:4, 15:6, etc.), azo dye, carbon black and pigment (e.g., titanium oxide), ethyl violet, crystal violet, azo dye, anthraquinone dye, and cyanine dye. The amount of the dye and pigment to be added is preferably from about 0.5% to 20% based on the total solid content of the photosensitive layer.

In addition, in order to improve the physical properties of the cured film, the composition of the present invention may comprise additives such as in organic filler and plasticizer, e.g., dioctyl phthalate, dimethyl phthalate and tricresyl phosphate.

The amount of these additives is preferably 10% or less based on the total solid content of the photosensitive layer.

In order to form the aforementioned photosensitive layer on the support described later, the composition for the photosensitive layer is dissolved in various organic solvents before use.

Examples of the solvent employable herein include acetone, methyl ethyl ketone, cyclohexane, ethyl acetate, ethylene dichloride, tetrahydrofuran, toluene, ethylene glycol monomethyl ether, ethylene glycol monoethyl ether, ethylene glycol dimethyl ether, propylene glycol monomethyl ether, propylene glycol monoethyl ether, acetyl acetone, cyclohexanone, diacetone alcohol, ethylene glycol monomethyl ether acetate, ethylene glycol ethyl ether acetate, ethylene glycol monoisopropyl ether, ethylene glycol monobutyl ether acetate, 3-methoxy propanol, methoxy methoxy ethanol, diethylene glycol monomethyl ether, diethylene glycol monoethyl ether, diethylene glycol dimethyl ether, diethylene glycol diethyl ether, propylene glycol monomethyl ether acetate, propylene glycol monoethyl ether acetate, 3-methoxy propyl acetate, N,N-dimethyl formamide, dimethyl sulfoxide, γ-butyrolactone, methyl lactate, and ethyl lactate. These solvents may be used singly or in admixture. The concentration of solid content in the coating solution is preferably from 1% to 50% by weight.

The aforementioned photopolymerizable photosensitive layer composition may comprise a surface active agent incorporated therein to improve the properties of the coated surface.

The coated amount of the photopolymerizable photosensitive layer composition is preferably from about 0.1 g/m$^2$ to 10 g/m$^2$, more preferably from 0.3 g/m$^2$ to 5 g/m$^2$, even more preferably from 0.5 g/m$^2$ to 3 g/m$^2$ as calculated in terms of dried amount.

[Acid Value of Photosensitive Layer]

The term "acid value of photosensitive layer" as used herein is meant to indicate the amount of an acid having a pKa value of 9 or less contained in 1 g of the layer of photosensitive composition (excluding overcoat layer such as oxygen-impermeable layer coated on the photosensitive layer) coated on the support of the photosensitive lithographic printing plate. The acid value of photosensitive layer can be experimentally determined directly by titrating the photosensitive layer with an aqueous solution of sodium hydroxide. Alternatively, it can be calculated from the content of a compound having a pKa value of 9 or less in the photosensitive composition.

As a specific method for modifying the acid value of photosensitive layer there may be used a method involving the change of the ratio of crosslinking agent monomer to binder polymer having an acid group (linear polymer) as components of photosensitive layer or a method involving the use of a low acid value binder polymer having little acid group.

The low acid value binder polymer preferably exhibits an acid value of not greater than 1.5 meq/g, more preferably not greater than 1.2 meq/g.

The acid value of the photosensitive layer of the present invention is preferably 1.0 meq/g. It is effective to apply the present invention to a lithographic printing plate comprising a photosensitive layer having an acid value of from 0.20 meq/g to 0.60 meq/g, preferably from 0.30 meq/g to 0.50 meq/g from the standpoint of image forming.

(Support)

The support of the photosensitive lithographic printing plate to be used herein is not specifically limited so far as it is a sheet-like material having a dimensional stability. In practice, however, an aluminum support is desirable.

The aluminum support may be selected from the group consisting of sheet of aluminum containing as a main component aluminum, which is dimensionally stable, and aluminum alloy (with a metal such as silicon, copper, manganese, magnesium, chromium, zinc, lead, bismuth and nickel), and plastic film or paper having aluminum or aluminum laminated or vacuum-evaporated thereon. Alternatively, a composite sheet having an aluminum sheet bonded to a polyethylene terephthalate film as described in Japanese Patent Publication No. 18327/1973 may be used. The aluminum support is properly subjected to substrate surface treatment as described later.

(Graining)

Examples of graining method include mechanical graining, chemical etching, and electrolytic graining as disclosed in Japanese Patent Laid-Open No. 28893/1981. Further examples of graining method include electrochemical graining involving electrochemical graining in a hydrochloric acid or nitric acid electrolytic solution and mechanical graining method such as wire brush graining method involving scratching on the surface of aluminum sheet with a metal wire, ball graining method involving graining on the surface of aluminum sheet with an abrasive ball and an abrasive material and brush graining method involving graining on the surface of aluminum sheet with a nylon brush and an abrasive material. These graining methods may be used singly or in combination.

Among these methods for forming surface roughness, the electrochemical method involving chemical graining in a hydrochloric acid or nitric acid electrolytic solution is useful. The current density is preferably from 100 C/dm$^2$ to 400 C/dm$^2$. In some detail, electrolysis is preferably effected in an electrolytic solution containing from 0.1% to 5% of hydrochloric acid or nitric acid at a temperature of from 20° C. to 100° C. for 1 second to 30 minutes and a current density of from 100 C/dm$^2$ to 400 C/dm$^2$.

The aluminum support thus grained is then subjected to chemical etching with an acid or alkali. When an acid is used as an etchant, it takes much time to destroy the microstructure to the disadvantage of industrial application of the present invention. However, this disadvantage can be eliminated by the use of an alkali as an etchant.

Examples of the alkali which can be preferably used herein include caustic soda, sodium carbonate, sodium aluminate, sodium metasilicate, sodium phosphate, potassium hydroxide, and lithium hydroxide. The concentration and temperature of the alkali are preferably from 1% to 50% and from 20° C. to 100° C., respectively. The electrolysis conditions are preferably predetermined such that the dissolved amount of Al is from 5 to 20 g/m$^3$.

The aluminum sheet thus etched is then subjected to washing with an acid to remove smut remaining on the surface thereof. As such an acid there may be used nitric acid, sulfuric acid, phosphoric acid, chromic acid, hydrofluoric acid, fluoroboric acid or the like. In particular, as a desmutting method to be effected after electrochemical roughening there is preferably used a method involving contact with a sulfuric acid having a temperature of from 50° C. to 90° C. and a concentration of from 15% to 65% by weight as described in Japanese Patent Laid-Open No. 12739/1978 or a method involving alkali etching as described in Japanese Patent Publication No. 28123/1973.

The surface roughness (Ra) of the Al support which is effectively used herein is from 0.3 μm to 0.7 μm.

Anodization

The aluminum support thus processed is then subjected to anodization.

Anodization can be carried out by any method which has heretofore been effected in the art. In some detail, when dc or ac is allowed to flow through the aluminum support in an aqueous solution or nonaqueous solution comprising sulfuric acid, phosphoric acid, chromic acid, oxalic acid, sulfamic acid, benzenesulfonic acid, etc., singly or in combination of two or more thereof, an anodized film is formed on the surface of the aluminum support.

The anodization conditions vary with the electrolytic solution used and thus cannot be unequivocally determined. In practice, however, the concentration of the electrolytic solution, the temperature of the electrolytic solution, the current density, the bath voltage and the electrolysis time are preferably from 1% to 80%, from 5° C. to 70° C., from 0.5 to 60 A/dm$^2$, from 1 to 100V, and from 10to 100 seconds, respectively.

Particularly preferred among these anodization methods are method involving anodization in sulfuric acid at a high current density as described in British Patent No. 1,412,768 and method involving anodization in phosphoric acid as an electrolytic bath as described in U.S. Pat. No. 3,511,661.

In the present invention, the density of anodized film is preferably from 1 to 10 g/m$^2$. When the density of anodized film is not greater than 1 g/m$^2$, the resulting printing plate can be easily damaged. On the contrary, it requires much electric power to produce an anodized film at a density of not smaller than 10 g/m$^2$ to the disadvantage of economy. The density of anodized film is preferably from 1.5 to 7 g/m$^2$, more preferably from 2 to 5 g/m$^2$.

In the present invention, the aluminum support which has been grained and anodized may be subjected to sealing. Sealing can be carried out by dipping the aluminum substrate in hot water or hot water solution of inorganic salt or organic salt or subjecting the aluminum substrate to steam bathing. The aluminum support may be subjected to treatment other than silicate treatment with an alkaline metal silicate, e.g., surface treatment such as dipping in an aqueous solution of potassium fluorozirconiumate, phosphate or the like.

As the support of the photosensitive lithographic printing plate of the present invention there is preferably used the following sheet-like material having a dimensional stability besides the aforementioned aluminum support. Examples of the sheet-like material include paper, paper laminated with plastic (e.g., polyethylene, polypropylene, polystyrene), metal plate (e.g., zinc, copper), plastic film (e.g., cellulose diacetate, cellulose triacetate, cellulose propionate, cellulose butyrate, cellulose acetobutyrate, cellulose nitrate, polyethylene terephthalate, polyethylene, polystyrene, polypropylene, polycarbonate, polyvinyl acetal), and paper or plastic film having the aforementioned metal laminated or vacuum-evaporated thereon.

The support is preferably subjected to surface hydrophilicization depending on the kind thereof. Examples of the surface hydrophilicization include chemical reaction such as etching, oxidation, reduction and sol-gel coating, and coating with a specific compound which can be adsorbed to the surface of the support.

For the anodized aluminum support for example, an organic compound having a phosphoric acid atom group (phosphoric acid, phosphonic acid, phosphinic acid) is preferably used.

By forming the aforementioned photosensitive layer on the aforementioned support, the photosensitive lithographic printing plate of the present invention can be produced. If necessary, an organic or inorganic undercoat layer may be provided before the provision of the photosensitive layer.

(Oxygen-Impermeable Protective Layer)

The photosensitive lithographic printing plate of the present invention may comprise an oxygen-impermeable protective layer mainly composed of a water-soluble vinyl polymer provided on the photopolymerizable photosensitive layer.

Examples of the water-soluble vinyl polymer to be incorporated in the oxygen-impermeable protective layer include polyvinyl alcohol, partial ester, ether and acetal thereof, and copolymer thereof containing unsubstituted vinyl alcohol unit in a substantial amount such that it is rendered water-soluble as necessary. As the polyvinyl alcohol there may be used one having a polymerization degree of from 300 to 2,400 which can be hydrolyzed in a proportion of from 71% to 100%.

Specific examples of the polyvinyl alcohol employable herein include PVA-105, PVA-110, PVA-117, PVA-117H, PVA-120, PVA-124, PVA-124H, PVA-CS, PVA-CST, PVA-HC, PVA-203, PVA-204, PVA-205, PVA-210, PVA-217, PVA-220, PVA-224, PVA-217EE, PVA-220, PVA-224, PVA-217EE, PVA-217E, PVA-220E, PVA-224E, PVA-405, PVA-420, PVA-613 and L-8produced by KURARAY CO., LTD.

Examples of the aforementioned copolymer include polyvinyl acetate chloroacetate or propionate which has been hydrolyzed in a proportion of from 88% to 100%, polyvinyl formal, polyvinyl acetal, and copolymer thereof.

Other examples of useful polymers include polyvinyl pyrrolidone, gelatin, and gum arabic. These polymers may be used, singly or in combination.

The solvent to be used in the provision of the oxygen-impermeable protective layer is preferably purified water. Purified water may be used in admixture with an alcohol such as methanol and ethanol or ketone such as acetone and methyl ethyl ketone. The concentration of solid content in the coating solution is preferably from 1% to 20% by weight.

The oxygen-impermeable protective layer may comprise a known additive such as surface active agent for improving coatability and water-soluble plasticizer for improving physical properties of film incorporated therein.

Examples of the water-soluble plasticizer employable herein include propionamide, cyclohexanediol, glycerin, and sorbitol. Alternatively, a water-soluble (meth)acrylic polymer or the like may be added.

The coated amount of the water-soluble plasticizer is preferably from about 0.1 g/m$^2$ to 15 g/m$^2$, more preferably from about 1.0 g/m$^2$ to 5.0 g/m$^2$ as calculated in terms of dried amount.

[Plate-Making Process]

The plate-making process of the present invention will be described hereinafter.

The plate-making process of the photosensitive lithographic printing plate of the present invention may involve heating on the entire surface of the lithographic printing plate before exposure, during exposure or between exposure and development as necessary. Such heating makes it possible to accelerate the image formation reaction in the photosensitive layer to advantage of enhancement of sensitivity and press life and stabilization of sensitivity. For the purpose of enhancing image intensity and press life, it is also effective to subject the image thus developed to entire post heating or entire exposure. In general, heating before development is preferably effected under mild conditions of 150° C. or lower. When the heating temperature is too high, it is disadvantageous in that the non-image area, too, is subject to fogging. Heating after development is effected under extremely strong conditions. In general, heating after development is effected at a temperature of from 200° C. to 500° C. When the heating temperature is too low, a sufficient effect of intensifying image cannot be obtained. On the contrary, when the heating temperature is too high, it causes problems of deterioration of support, thermal decomposition of image area, etc.

As a method for exposing the photosensitive lithographic printing plate of the present invention to light there may be used any known exposure method without any restriction. As a light source there is preferably used a laser. For example, as a laser source capable of emitting a laser beam having a wavelength of from 350 nm to 450 nm there may be used any of the following laser sources.

Examples of gas lasers include Ar ion laser (364 nm, 351 nm, 10 mW to 1 W), Kr laser ion (356 nm, 351 nm, 10 mW to 1 W), and He—Cd laser (441 nm, 325 nm, 1 mW to 100 mw).

Examples of solid lasers include combination of Nd:YAG (YVO4) and two SFG crystals (355 mm, 5 mW to 1 W), and combination of Cr:LiSAF and SHG crystal (430 nm, 10 mW).

Examples of semiconductor laser systems include KNbO$_3$, ring resonator (430 nm, 30 mW), combination of wave guide type wavelength conversion element and AlGaAs or InGaAks semiconductor (380 nm to 450 nm, 5 mW to 100 mw), combination of wave guide type wavelength conversion element and AlGaInP or AlGaAs semiconductor (300 nm to 350 nm, 5 mw to 100 mW), and AlGaInN (350 nm to 450 nm, 5 mW to 30 mw).

Examples of pulse lasers include N$_2$ laser (337 nm, pulse: 0.1 to 10 mJ), and XeF (351 nm, pulse: 10 to 250 mJ).

Particularly preferred among these lasers is AlGaInN semiconductor laser (commercially available InGaN semiconductor laser: 400 to 410 nm; 5 to 30 mW) from the standpoint of wavelength and cost.

Examples of commercially available light sources capable of emitting a light beam having a wavelength of from 450 nm to 700 nm which can be preferably used include Ar+laser (488 nm), YAG-SHG laser (532 nm), He—Ne laser (633 nm), He—Cd laser, and red semiconductor laser (650 nm to 690 nm). Examples of commercially available light sources capable of emitting a light beam having a wavelength of from 700 nm to 1,200 nm which can be preferably used include semiconductor laser (800 nm to 850 nm), and Nd-YAG laser (1,064 nm).

In addition, a mercury lamp of super high pressure, high pressure and middle pressure, a chemical lamp, carbon-arc lamp, a xenon lamp, a metal halide lamp, a UV-laser lamp (e.g., ArF eximer laser and KrF eximer laser) and a radiation (e.g., electron beam, X-ray, ion beam and far infrared ray) can be also used.

The laser-light source of 350 nm or more is preferably used because of the safety. Among these, combination use of the photosensitive lithographic printing plate having a sensitive region of 500 nm or less and InGaN-series semiconductor laser of 400 to 410 nm capable of imparting the safety against a yellow lamp is particularly preferred.

The exposure mechanism employable herein may be any of inner surface drum system, external surface drum system, flat head system, etc. As the photosensitive layer of the photosensitive lithographic printing plate of the present invention there may be used any material having a high water solubility to render the photosensitive layer soluble in neutral water or weak aqueous alkali. The photosensitive lithographic printing plate having such an arrangement can be mounted on the printing machine to carry out on-machine exposure/development process.

The photosensitive lithographic printing plate thus developed is then subjected to post treatment with wash water, a rinse solution containing a surface active agent or the like or a desensitizing solution containing gum arabic, starch derivative or the like as described in Japanese Patent Laid-Open No. 8002/1979, Japanese Patent Laid-Open No. 115045/1980 and Japanese Patent Laid-Open No. 58431/1984. For the post treatment of the photosensitive lithographic printing plate of the present invention, these treatments may be employed in combination.

The lithographic printing plate obtained by such a treatment is then mounted on an offset printing machine by which printing is made on a plurality of sheets.

The aforementioned photosensitive lithographic printing plate is then subjected to development with the following developer to form an image thereon, exerting the effect of the present invention.

(Developer)

The developer components will be described in detail hereinafter.

The developer to be used in the plate-making process of the present invention contains a nonionic compound represented by the following general formula (III):

$$A\text{-}W \tag{III}$$

wherein A represents a hydrophobic organic group log P of which is not smaller than 1.5 as determined in the form of A-H; and W represents a nonionic hydrophilic organic group log P of which falls below 1.0 as determined in the form of W-H.

The term "log P" as used herein is normally used as a hydrophobic parameter described in C. Hansch, A. Leo, "Substituent Constants for Correlation Analysis in Chemistry and Biology", J. Wile & Sons, 1979 and is defined as the logarithm of equilibrium concentration ratio P calculated from the ratio distributed in the various layers of octanol/water double layer system of desired molecule (A-H and W-H).

The log P value is used as an index specifying the various groups A and W in the general formula (III) herein. In some detail, calculation is made on known data with respect to A-H and W-H structures, which are obtained by connecting a hydrogen atom to the organic groups A and W for convenience, according to the method described in A. K. Ghose, et al., "J. Comput. Chem.", 9, 80, 1988.

In some detail, the organic groups A and w differ from each other in structure and each represent a monovalent organic residue satisfying the aforementioned log P. More preferably, the organic groups A and W are the same or different and each represent a hydrocarbon group which may have hydrogen atom, halogen atom and substituents and may contain an unsaturated bond, heterocyclic group, hydroxyl group, substituted oxy group, mercapto group, substituted thio group, amino group, substituted amino group, substituted carbonyl group, carboxylato group, sulfo group, sulfonate group, substituted sulfinyl group, substituted sulfonyl group, phosphono group, substituted phosphono group, phosphonato group, substituted phosphonato group, cyano group or nitro group.

Examples of the aforementioned hydrocarbon group which may have substituents and contain an unsaturated bond include alkyl group, substituted alkyl group, aryl group, substituted aryl group, alkenyl group, substituted alkenyl group, alkynyl group, and substituted alkynyl group.

Examples of the alkyl group include $C_1$–$C_{20}$ straight-chain, branched or cyclic alkyl group. Specific examples thereof include methyl group, ethyl group, propyl group, butyl group, pentyl group, hexyl group, heptyl group, octyl group, nonyl group, decyl group, undecyl group, dodecyl group, tridecyl group, hexadecyl group, octadecyl group, eicosyl group, isopropyl group, isobutyl group, s-butyl group, t-butyl group, isopentyl group, neopentyl group, 1-methylbutyl group, isohexyl group, 2-ethylhexyl group, 2-methylhexyl group, cyclohexyl group, cyclopentyl group, and 2-norbornyl group. Preferred among these alkyl groups are $C_1$–$C_{12}$ straight-chain alkyl group, $C_3$–$C_{12}$ branched alkyl group, and $C_5$–$C_{10}$ cyclic alkyl group.

The substituted alkyl group is formed by connecting substituents to an alkylene group. As these substituents there maybe used monovalent non-metallic atom groups except hydrogen. Preferred examples of these non-metallic atom groups include halogen atom (—F, —Br, —Cl, —I), hydroxyl group, alkoxy group, aryloxy group, mercapto group, alkylthio group, arylthio group, alkyldithio group, aryldithio group, amino group, N-alkylamino group, N,N-dialkylamino group, N-arylamino group, N,N-diarylamino group, N-alkyl-N-arylamino group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-N-arylcarbamoyloxy group, alkylsulfoxy group, arylsulfoxy group, acylthio group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N'N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamino group, aryloxycarbonylamino group, N-alkyl-N-alkoxycarbonylamino group, N-alkyl-N-aryloxycarbonylamino group, N-aryl-N-alkoxycarbonylamino group, N-aryl-N-aryloxycarbonylamino group, formyl group, acyl group, carboxyl group and conjugated base thereof (hereinafter referred to as "carboxylate"), alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, N-alkyl-N-arylcarbamoyl group, alkylsulfinyl group, arylsulfinyl group, alkylsulfonyl group, arylsulfonyl group, sulfo group (—$SO_3H$) and conjugated base thereof (hereinafter referred to as "sulfonate"), alkoxysulfonyl group, aryloxysulfonyl group, sulfinamoyl group, N-alkylsulfinamoyl group, N,N-dialkylsulfinamoyl group, N-arylsulfinamoyl group, N,N-diarylsulfinamoyl group, N-alkyl-N-arylsulfinamoyl group, sulfamoyl group, N-alkylsulfamoyl group, N,N-dialkylsulfamoyl group, N-arylsulfamoyl group, N,N-diarylsulfamoyl group, N-alkyl-N-arylsulfamoyl group, N-acylsulfamoyl group and conjugated base thereof, N-alkylsulfonylsulfamoyl group (—$SO_2NHSO_2$ (alkyl) and conjugated base thereof, N-arylsulfonylsulfamoyl group (—$SO_2NHSO_2$(aryl)) and conjugated base thereof, N-alkylsulfonylcarbamoyl group (—$CONHSO_2$ (alkyl)) and conjugated base thereof, N-arylsulfonylcarbamoyl group (—$CONHSO_2$ (aryl)) and conjugated base thereof, alkoxysilyl group (—Si (Oalkyl)$_3$), aryloxysilyl group (—Si (Oaryl)$_3$), hydroxysilyl group (—Si(OH)$_3$) and conjugated base thereof, phosphono group (—$PO_3H_2$) and conjugated base thereof (hereinafter referred to as "phosphonato group"), dialkylphosphono group (—$PO_3(\text{alkyl})_2$), diarylphosphono group (—PO₃ (aryl)₂) alkylarylphosphono group (—PO₃ (alkyl) (aryl)), monoalkylphosphono group (—PO₃H(alkyl)) and conjugated base thereof (hereinafter referred to as "alkylphosphonato group"), monoarylphosphono group (—PO₃H(aryl)) and conjugated base thereof (hereinafter referred to as "arylphosphonato group"), phosphonoxy group —OPO₃H₂) and conjugated base thereof (hereinafter referred to as "phosphonatoxy group"), dialkylphosphonoxy group (—OPO₃(alkyl)₂), diarylphosphonoxy group (—OPO₃(aryl)₂), alkylarylphosphonoxy group (—OPO₃(alkyl) (aryl)), monoalkylphosphonoxy group (—OPO₃H(alkyl)) and conjugated base thereof (hereinafter referred to as "alkylphosphonatoxy group"), monoarylphosphonoxy group (—OPO₃H(aryl)) and conjugated base thereof (hereinafter referred to as "arylphosphonatoxy group"), cyano group, nitro group, aryl group, alkenyl group, and alkynyl group.

Specific examples of the alkyl group in these substituents include the alkyl group previously described. Specific examples of the aryl group include phenyl group, biphenyl group, naphthyl group, tollyl group, xylyl group, mesityl group, cumenyl group, fluorophenyl group, chlorophenyl group, bromophenyl group, chloromethylphenyl group, hydroxyphenyl group, methoxyphenyl group, ethoxyphenyl group, phenoxyphenyl group, acetoxyphenyl group, benzoyloxyphenyl group, methylthiphenyl group, phenylthiophenyl group, methylaminophenyl group, dimethylaminophenyl group, acetylaminophenyl group, carboxyphenyl group, methoxycarbonylphenyl group, ethoxycarbonylphenyl group, phenoxycarbonylphenyl group, N-phenylcarbamoylphenyl group, phenyl group, nitrophenyl group, cyanophenyl group, sulfophenyl group, sulfonatophenyl group, phosphonophenyl group, and phosphonatophenyl group. Specific examples of the alkenyl group include vinyl group, 1-propenyl group, 1-butenyl group, cinnamyl group, and 2-chloro-1-ethenyl group. Specific examples of the alkynyl group include ethynyl group, 1-propynyl group, 1-butynyl group, trimethylsilylethynyl group, and phenylethynyl group.

Examples of the aforementioned acyl group ($R^{31}CO—$) include those wherein $R^{31}$ is a hydrogen atom or the aforementioned alkyl group, aryl group, alkenyl group or alkynyl group. On the other hand, examples of the alkylene group in the substituted alkyl group include a divalent organic residue obtained by removing any one of the hydrogen atoms on the aforementioned $C_1$–$C_{20}$ alkyl group. Preferred examples of the alkylene group include $C_1$–$C_{12}$ straight-chain alkylene group, $C_3$–$C_{12}$ branched alkylene group, and $C_5$–$C_{10}$ cyclic alkylene group. Preferred examples of the substituted alkyl group include chloromethyl group, bromomethyl group, 2-chloroethyl group, trifluoromethyl group, methoxymethyl group, methoxyethoxyethyl group, allyloxymethyl group, phenoxymethyl group, methylthiomethyl group, trithiomethyl group, ethylaminoethyl group, diethylaminopropyl group, morpholinopropyl group, acetyloxymethyl group, benzoyloxymethyl group, N-cyclohexylcarbamoyloxyethyl group, N-phenylcarbamoyloxyethyl group, acetylaminoethyl group, N-methylbenzoylaminopropyl group, 2-oxoethyl group, 2-oxopropyl group, carboxypropyl group, methoxycarbonylethyl group, methoxycarbonylmethyl group, methoxycarbonylbutyl group, ethoxycarbonylmethyl group, butoxycarbonylmethyl group, allyloxycarbonylmethyl group, benzyloxycarbonylmethyl group, methoxycarbonylphenylmethyl group, trichloromethylcarbonylmethyl group, allyloxycarbonylbutyl group, chlorophenoxycarbonylmethyl group, carbamoylmethyl group, N-methylcarbamoylethyl group, N,N-dipropylcarbanoylmethyl group, N-(methoxyphenyl) carbamoylethyl group, N-methyl-N-(sulfonyl) carbamoylmethyl group, sulfopropoyl group, sulfobutyl group, sulfonatobutyl group, sulfamoylbutyl group, N-ethylsulfamoylmethyl group, N,N-dipropylsulfamoylpropyl group, N-tollylsulfamoylpropyl group, N-methyl-N-(phosphonophenyl)sulfamoyloctyl group,

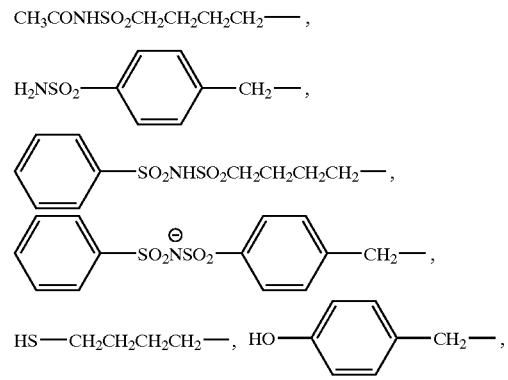

phosphonobutyl group, phosphonatohexyl group, diethylphosphonobutyl group, diphenylphosphonopropyl group, methylphoshonobutyl group, methylphosphonobutyl group, tollylphosphonohexyl group, tollylphosphonatohexyl group, phosphonoxypropyl group, phosphonatoxybutyl group, benzyl group, phenethyl group, a-methylbenzyl group, 1-methyl-1-phenylethyl group, p-methylbenzyl group, cinnamyl group, allyl group, 1-propenylmethyl group, 2-butenyl group, 2-methylallyl group, 2-methylpropenylmethyl group, 2-propynyl group, 2-butynyl group, and 3-butynyl group.

Examples of the aryl group include cyclic aryl group formed by condensing $C_1$–$C_3$ benzene rings, and cyclic aryl group formed by condensing benzene ring with 5-membered unsaturated ring. Specific examples of these cyclic aryl groups include phenyl group, naphthyl group, anthryl group, phenanthryl group, indenyl group, acenabutenyl group, and fluorenyl group. Preferred among these cyclic aryl groups are phenyl group, and naphthyl group.

The substituted aryl group is formed by connecting substituents to an aryl group. As the substituents on the carbon atoms forming the aforementioned cyclic aryl group there may be used those containing a monovalent non-metallic atom group except hydrogen. Preferred examples of these substituents include the aforementioned alkyl group and substituted alkyl group, and those described as substituents in the substituted alkyl group. Specific examples of the substituted aryl group include biphenyl group, tollyl group, xylyl group, mesityl group, cumenyl group, chlorophenyl group, bromophenyl group, fluorophenyl group, chloromethylphenyl group, trifluoromethylphenyl group, hydroxyphenyl group, methoxyphenyl group, methoxyethoxyphenyl group, allyloxyphenyl group, phenoxyphenyl group, methylthiophenyl group, tollylthiophenyl group, phenylthiophenyl group, ethylaminophenyl group, diethylaminophenyl group, morpholinophenyl group, acetyloxyphenyl group, benzoyloxyphenyl group, N-cyclohexylcarbamoyloxyphenyl group, N-phenylcarbamoyloxyphenyl group, acetylaminophenyl group, N-methylbenzoylaminophenyl group, carboxyphenyl group, methoxycarbonylphenyl group, allyloxycarbonylphenyl group, chlorophenoxycarbonylphenyl group, carbamoylphenyl group, N-methylcarbamoylphenyl group, N,N-dipropylcarbamoylphenyl group, N-(methoxyphenyl)carbamoylphenyl group, N-methyl-N-(sulfophenyl)carbamoylphenyl group, sulfophenyl group, sulfonatophenyl group, sulfamoylphenyl group, N-ethylsulfamoylphenyl group, N,N-dipropylsulfamoylphenyl group, N-tollylsulfamoylophenyl group, N-methyl-N-(phosphonophenyl)sulfamoylphenyl group, phosphonophenyl group, phosphonatophenyl group, diethylphoshonophenyl group, diphenylphosphonophenyl group, methylphosphonophenyl group, methylphoshonatophenyl group, tollylphosphonophenyl group, tollylphosphonatophenyl group, allyl group, 1-propenylmethyl group, 2-butenyl group, 2-methylallylphenyl group, 2-methylpropenylphenyl group, 2-propynylphenyl group, 2-butynylphenyl group, and 3-butynylphenyl group.

Examples of the alkenyl group include those described above. The substituted alkenyl group is formed by substituting substituents for the hydrogen atom in the alkenyl group. As such substituents there may be used the substituents in the aforementioned substituted alkyl group. On the other hand, as the alkenyl group there maybe used the aforementioned alkenyl group. Preferred examples of the substituted alkenyl group include the following groups:

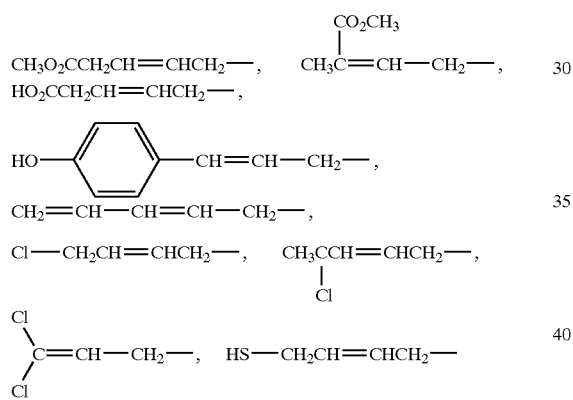

Examples of the alkynyl group include those described above. The substituted alkynyl group is formed by substituting substituents for the hydrogen atom in the alkynyl group. As these substituents there may be used substituents in the aforementioned substituted alkyl group. On the other hand, as the alkynyl group there maybe used the aforementioned alkynyl group.

The heterocyclic group is a monovalent group obtained by removing one hydrogen atom from a heterocyclic group or a monovalent group (substituted heterocyclic group) obtained by removing another hydrogen atom from the monovalent group, and then connecting substituents in the aforementioned substituted alkyl group to the monovalent group. Preferred examples of the heterocyclic group include the following groups:

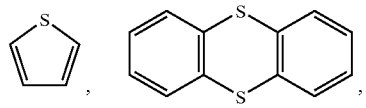

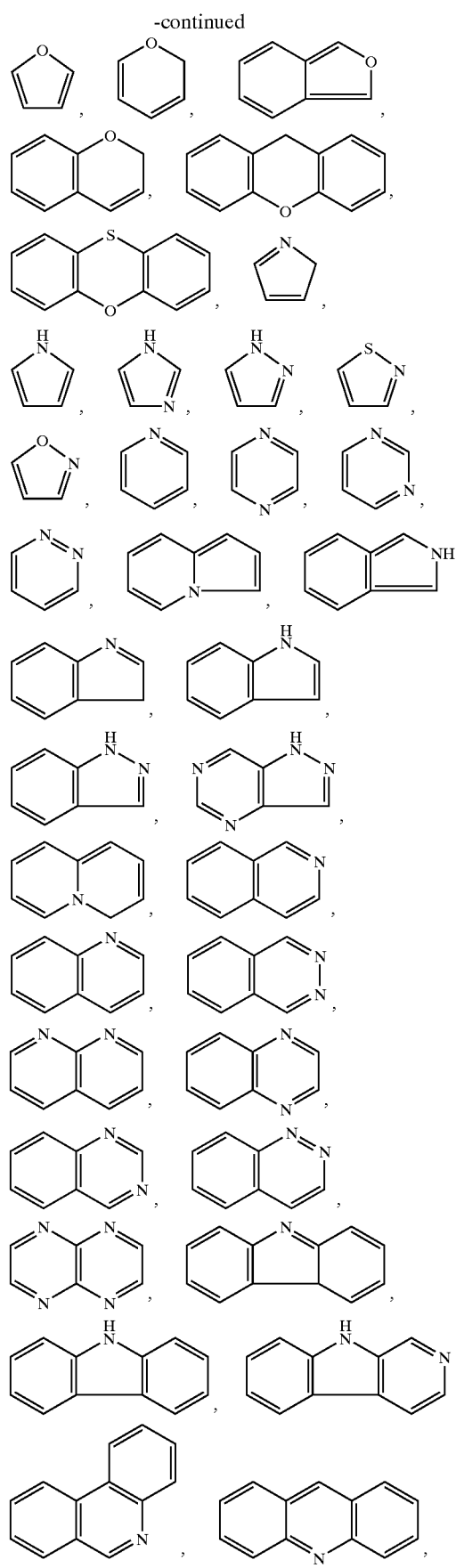

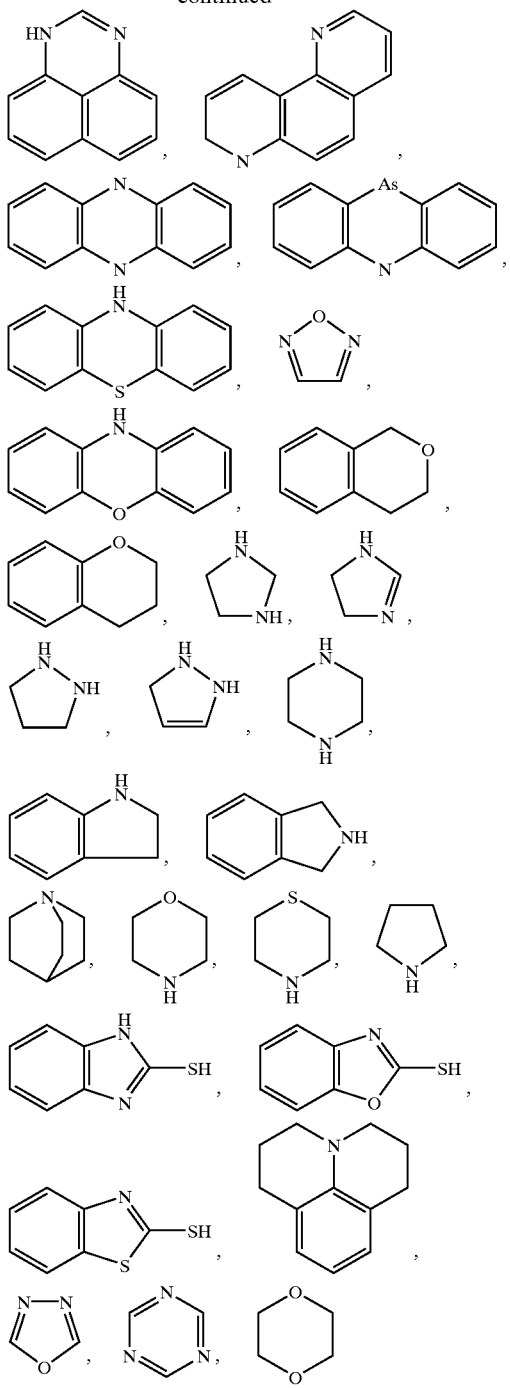

group ($R^6CO$—) in the acyloxy group include those wherein $R^6$ is the aforementioned alkyl group, substituted alkyl group, aryl group and substituted aryl group. Preferred among these substituents are alkoxy group, aryloxy group, acyloxy group, and arylsulfoxy group. Specific preferred examples of the substituted oxy group include methoxy group, ethoxy group, propyloxy group, isopropyloxy group, butyloxy group, pentyloxy group, hexyloxy group, dodecyloxy group, benzyloxy group, allyloxy group, phenethyloxy group, carboxyethyloxy group, methoxycarbonylethyloxy group, ethoxycarbonylethyloxy group, methoxyethoxy group, phenoxyethoxy group, methoxyethoxyethoxy group, ethoxyethoxyethoxy group, morpholinoethoxy group, morpholinopropyloxy group, allyloxyethoxyethoxy group, phenoxy group, tollyloxy group, xylyloxy group, mesityloxy group, cumenyloxy group, methoxyphenyloxy group, ethoxyphenyloxy group, chlorophenyloxy group, bromophenyloxy group, acetyloxy group, benzoyloxy group, naphthyloxy group, phenylsulfonyloxy group, phosphonoxy group, and phosphonatoxy group.

As the substituted thio group ($R^{33}S$—) there may be used a monovalent non-metallic atom group where $R^{33}$ is not a hydrogen atom. Preferred examples of the substituted thio group include alkylthio group, arylthio group, alkyldithio group, aryldithio group, and acylthio group. Examples of the alkyl group and aryl group in these substituted thio groups include the aforementioned alkyl group and substituted alkyl group, and those described as aryl group and substituted aryl group. $R^6$ in the acyl group (R6CO—) in the acylthio group is as defined above. Preferred among these substituted thio groups are alkylthio group and arylthio group. Specific preferred examples of the substituted thio group include methyl thio group, ethylthio group, phenylthio group, ethoxyethylthio group, carboxyethylthio group, and methoxycarbonylthio group.

As the substituted amino group ($R^{34}NH$—, $(R^{35})(R^{36})N$—) there may be used a monovalent non-metallic atom group where $R^{34}$, $R^{35}$ and $R^{36}$ each are not a hydrogen atom. Preferred examples of the substituted amino group include N-alkylamino group, N,N-dialkylamino group, N-arylamino group, N,N-diarylamino group, N-alkyl-N-arylamino group, acylamino group, N-alkylacylamino group, N-arylacylamino group, ureido group, N'-alkylureido group, N',N'-dialkylureido group, N'-arylureido group, N',N'-diarylureido group, N'-alkyl-N'-arylureido group, N-alkylureido group, N-arylureido group, N'-alkyl-N-alkylureido group, N'-alkyl-N-arylureido group, N',N'-dialkyl-N-alkylureido group, N',N'-dialkyl-N-arylureido group, N'-aryl-N-alkylureido group, N'-aryl-N-arylureido group, N',N'-diaryl-N-alkylureido group, N',N'-diaryl-N-arylureido group, N'-alkyl-N'-aryl-N-alkylureido group, N'-alkyl-N'-aryl-N-arylureido group, alkoxycarbonylamio group, aryloxycarbonylamino group, N-alkyl-N-alkoxycarbonylamino group, N-alkyl-N-aryloxycarbonylamino group, N-aryl-N-alkoxycarbonylamino group, and N-aryl-N-aryloxycarbonylamino group. Examples of the alkyl group and aryl group in these substituted amino groups include the aforementioned alkyl group and substituted alkyl group, and those described as aryl group and substituted aryl group. $R^{33}$ in the acyl group ($R^{33}CO$—) in the acylamino group, N-alkylacylamino group and N-arylacylamino group is as defined above. Preferred among these substituted amino groups are N-alkylamino group, N,N-dialkylamino group, N-arylamino group, and acylamino group. Specific preferred examples of the substituted amino group include methylamino group, ethylamino group, diethylamino group, mor- As the substituted oxy group ($R^{32}O$—) there may be used a monovalent non-metallic atom group wherein $R^{32}$ is not a hydrogen atom. Preferred examples of the substituted oxy group include alkoxy group, aryloxy group, acyloxy group, carbamoyloxy group, N-alkylcarbamoyloxy group, N-arylcarbamoyloxy group, N,N-dialkylcarbamoyloxy group, N,N-diarylcarbamoyloxy group, N-alkyl-arylcarbamoyloxy group, alkylsulfoxy group, arylsulfoxy group, phosphonoxy group, and phosphonatoxy group. Examples of the alkyl group and aryl group in these substituted oxy groups include the aforementioned alkyl group and substituted alkyl group, and those described as aryl group and substituted aryl group. Examples of the acyl pholino group, piperidino group, pyrrolidino group, phenylamino group, benzoylamino group, and acetylamino group.

As the substituted carbonyl group ($R^{37}$—CO—) there may be used a substituted carbonyl group wherein $R^{37}$ is a monovalent non-metallic atom group. Preferred examples of the substituted carbonyl group include formyl group, acyl group, carboxyl group, alkoxycarbonyl group, aryloxycarbonyl group, carbamoyl group, N-alkylcarbamoyl group, N,N-dialkylcarbamoyl group, N-arylcarbamoyl group, N,N-diarylcarbamoyl group, and N-alkyl-N-arylcarbamoyl group. Examples of the alkyl group and aryl group in these substituted carbonyl groups include the aforementioned alkyl group and substituted alkyl group, and those described as aryl group and substituted aryl group. Preferred among these substituents are formyl group, acyl group, carboxyl group, alkoxycarbonyl group, aryloxycarbonyl group, carbamoyl group, N-alkylcarbamoyl group, N,N-dialkylcarbamoyl group, and N-arylcarbamoyl group. Particularly preferred among these substituents are formyl group, acyl group, alkoxycarbonyl group, and aryloxycarbonyl group. Specific preferred examples of the substituents include formyl group, acetyl group, benzoyl group, carboxyl group, methoxycarbonyl group, allyloxycarbonyl group, N-methylcarbamoyl group, N-phenylcarbamoyl group, N,N-diethylcarbamoyl group, and morpholinocarbonyl group.

As the substituted sulfinyl group ($R^{38}$—SO—) there may be used a substituted sulfinyl group wherein $R^{38}$ is a monovalent non-metallic atom group. Preferred examples of the substituted sulfinyl group include alkylsulfinyl group, arylsulfinyl group, sulfinamoyl group, N-alkylsulfinamoyl group, N,N-dialkylsulfinamoyl group, N-arylsulfinamoyl group, N,N-diarylsulfinamoyl group, and N-alkyl-N-arylsulfinamoyl group. Examples of the alkyl group and aryl group in these substituted sulfinyl groups include the aforementioned alkyl group and substituted alkyl group, and those described as aryl group and substituted aryl group. Preferred among these substituted sulfinyl groups are alkylsulfinyl group, and arylsulfinyl group. Specific examples of the substituted sulfinyl group include hexylsulfinyl group, benzylsulfinyl group, and tollylsulfinyl group.

As the substituted sulfonyl group ($R^{39}$—$SO_2$—) there may be used a substituted sulfonyl group wherein $R^{39}$ is a monovalent non-metallic atom group. Preferred examples of the substituted sulfonyl group include alkylsulfonyl group, and arylsulfonyl group. Examples of the alkyl group and aryl group in these substituted sulfonyl groups include the aforementioned alkyl group and substituted alkyl group, and those described as aryl group and substituted aryl group. Specific examples of the substituted sulfonyl group include butylsulfonyl group, and chlorophenylsulfonyl group.

The sulfonato group (—$SO_3$—) means a cation group of conjugated base of sulfo group (—$SO_3H$) as previously described. In general, the sulfonato group is preferably used with a counter cation. Examples of such a counter cation include generally known counter cations, i.e., various oniums (e.g., ammonium, sulfonium, phosphonium, iodonium, azinium), and metallic ions (e.g., $Na^+$, $K^+$, $Ca^{2+}$, $Zn^{2+}$).

The carboxylato group (—$CO_2$—) means a cation group of conjugated base of carboxyl group ($CO_2H$) as previously mentioned In general, the carboxylato group is preferably used with a counter cation. Examples of such a counter cation include generally known counter cations, i.e., various oniums (e.g., ammonium, sulfonium, phosphonium, iodonium, azinium), and metallic ions (e.g., $Na^+$, $K^+$, $Ca^{2+}$, $Zn^{2+}$).

The substituted phosphono group means one obtained by substituting one or two of the hydroxyl groups on the phosphono group by other organic oxo groups. Preferred examples of the substituted phoshono group include the aforementioned dialkylphosphono group, diarylphosphono group, alkylarylphosphono group, monoalkylphosphono group, and monoarylphosphono group. Preferred among these substituted phosphono groups are dialkylphosphono group, and diarylphosphono group. Specific examples of these substituted phosphono groups include diethylphosphono group, dibutylphosphono group, and diphenylphosphono group.

The phosphonato group (—$PO_3^{2-}$, —$PO_3 H^-$) means an anion group of conjugated base derived from acid primary dissociation or acid secondary dissociation of phosphono group (—$PO_3H_2$) as previously mentioned. In general, the phosphonato group is preferably used with a counter cation. Examples of such a counter cation include generally known counter cations, i.e., various oniums (e.g., ammonium, sulfonium, phosphonium, iodonium, azinium),and metallicions (e.g., $Na^+$, $K^+$, $Ca^{2+}$, $Zn^{2+}$).

The substituted phosphonato group is an anion group of conjugated base of the aforementioned substituted phosphono group wherein one of the hydroxyl groups is substituted by an organic oxo group. Specific examples of the substituted phosphonato group include conjugated base of the aforementioned monoalkylphosphono group (—$PO_3H$(alkyl)) and monoarylphosphono group (—$PO_3H$(aryl)). In general, the substituted phosphonato group is preferably used with a counter cation. Examples of such a counter cation include generally known counter cations, i.e., various oniums (e.g., ammonium, sulfonium, phosphonium, iodonium, azinium), and metallic ions (e.g. $Na_+$, $K^+$, $Ca^{2+}$, $Zn^{2+}$).

In the general formula (III), the structures A and W are more preferably an organic group containing an aromatic group and a nonionic organic group containing a polyoxyalkylene group, respectively.

Specific examples of A-H and W-H will be given below.

Example of A-H

logP = 2.05

(1)

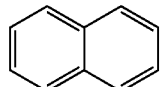

3.05

(2)

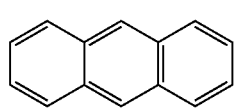

4.05

(3)

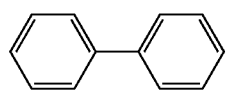

3.73

(4)

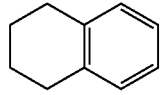

3.27

(5)

-continued

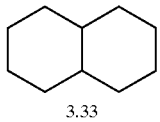
3.33

2.38

(8) Straight-chain or branched $C_nH_{2n+2}$ (n is an integer of 4 or more) 2.09 (in the case where it is butane)

(9) Straight-chain or branched $C_nH_{2n}$ (n is an integer of 4 or more)

(10) Straight-chain or branched $C_nH_{2n-2}$ (n is an integer of 4 or more)

The hydrogen atoms on the aforementioned structures (1) to (10) may be substituted by the aforementioned substituents on hydrocarbon.

Examples of W-H

| | | |
|---|---|---|
| (1) | HO—(CH$_2$CH$_2$O)$_n$—H | (n is an integer of 1 or more)<br>logP (−0.71 (n = 1), −1.37 (n = 5)<br>−2.19 (n = 10), −3.02 (n = 15)) |
| (2) | HO—(CHCH$_2$O)$_n$—H<br>       \|<br>       CH$_3$ | (n is an integer of 1 or more)<br>logP (−0.30 (n = 1), 0.70 (n = 5)) |
| (3) | HO—(CH2CH2O)$_n$—(CHCH2O)$_m$—H<br>                              \|<br>                              CH$_3$ | (n and m each are an integer of 1 or more) |
| (4) | HS—(CH$_2$CH$_2$O)$_n$—H | (n is an integer of 1 or more) |
| (5) | HO—(CH$_2$CH$_2$CH$_2$O)$_n$—H | (n is an integer of 1 or more) |
| (6) | HO—(CH$_2$CH$_2$N)$_n$—H<br>              \|<br>              H | (n is an integer of 1 or more) |
| (7) | H$_2$N—(CH$_2$CH$_2$N)$_n$—H<br>                \|<br>                H | (n is an integer of 1 or more) |
| (8) | α—(CH$_2$CH)$_n$—ω<br>         \|<br>         OH | (n is an integer of 1 or more) |
| (9) | α—(CH$_2$CH)$_n$—ω<br>         \|<br>         NH$_2$ | (n is an integer of 1 or more) |
| (10) | α—(CH$_2$CH)$_n$—ω<br>          \|<br>          C≡N | (n is an integer of 1 or more) |
| (11) | α—(CH$_2$CH)$_n$—ω<br>          \|<br>          CONH$_2$ | (n is an integer of 1 or more) |
| (12) | α—(CH$_2$CH)$_n$—ω<br>          \|<br>          CH$_2$OH | (n is an integer of 1 or more) |
| (13) | α—(CH$_2$CH)$_n$—ω<br>          \|<br>          CH$_2$NH$_2$ | (n is an integer of 1 or more) |
| (14) | α—(CH$_2$CH)$_n$—ω<br>          \|<br>          CO$_2$\~\~OH | |

(wherein α and ω each represent —OH, —H, —SH or —NH$_2$; and the hydrogen atoms on the aforementioned structures (1) to (10) may be substituted by the aforementioned substituents on hydrocarbon)

Specific examples of the nonionic compound of the general formula (III) will be given below.

[Examples of compound of the general formula (III)]

A—W

Y-1 through Y-22: chemical structures.

Preferred examples of the nonionic compound of the general formula (III) are those represented by the following general formulae (I-A) and (I-B).

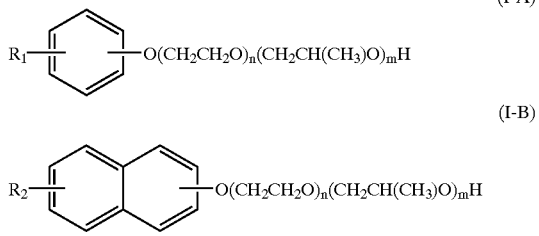

wherein $R_1$ and $R_2$ each represent a $C_1$–$C_{100}$ alkyl group; and n and m each represent an integer of from 0 to 100.

Examples of the compound represented by the general formula (I-A) include polyoxyethylene phenyl ether, polyoxyethylene methyl phenyl ether, polyoxyethylene octyl phenyl ether, and polyoxyethylene nonyl phenyl ether.

Examples of the compound represented by the general formula (I-B) include polyoxyethylene naphthyl ether, polyoxyethylene methyl naphthyl ether, polyoxyethylene octyl naphthyl ether, and polyoxyethylene nonyl naphthyl ether.

In the compounds of the general formulae (I-A) and (I-B), the number of polyoxyethylene chain repeating units is preferably from 3 to 50, more preferably from 5 to 30. The number of polyoxypropylene chain repeating units is preferably from 0 to 10 more preferably from 0 to 5. The polyoxyethylene moiety and the polyoxypropylene moiety each may be a random or block copolymer.

The nonionic aromatic ether-based active agents represented by the general formulae (I-A) and (I-B) maybe used singly or in combination of two or more thereof.

In the present invention, the nonionic compound represented by the general formula (III) is added in an amount of from 1% to 20% by weight, preferably from 2% to 10% by weight based on the weight of the developer to advantage.

When the added amount of the nonionic compound represented by the general formula (III) is too small, it causes the deterioration of developability and solubility of photosensitive layer components. On the contrary, when the added amount of the nonionic compound represented by the general formula (III) is too great, it causes the deterioration of press life of the printing plate.

[Chelating Agent]

The developer to be used in the present invention may comprise a chelating agent incorporated therein. Examples of the chelating agent include polyphosphates such as $Na_2P_2O_7$, $Na_5P_3O_3$, $Na_3P_3O_9$, $Na_2O_4P$ ($NaO_3P$) $PO_3Na_2$ and Calgon (sodium polymetaphosphate), aminopolycarboxylates such as ethylenediaminetetraacetic acid, potassium and sodium salts thereof, diethylenetriaminepentaacetic acid and potassium and sodium salts thereof, triethylenetetraminehexaacetic acid and potassium and sodium salts thereof, hydroxyethylethylenediaminetriacetic acid and potassium and sodium salts thereof, nitrilotriacetic acid and potassium and sodium salts thereof, 1,2-diaminocyclohexanetetraacetic acid and potassium and sodium salts thereof and 1,3-diamino-2-propanoltetraacetic acid and potassium and sodium salts thereof, and organic phosphonic acids such as 2-phosphonobutanetricarboxylic acid-1,2,4 and potassium and sodium salts thereof, 2-phosphonobutanetricarboxylic acid-2,3,4 and potassium and sodium salts thereof, 1-phosphonoethanetricarboxylic acid-1,2,2 and potassium and sodium salts thereof, 1-hydroxyethane-1,1-diphosphonic acid and potassium and sodium salts thereof and aminotri (methylenephosphonic acid) and potassium and sodium salts thereof.

The optimum amount of such a chelating agent varies with the hardness and amount of hard water used. In general, the chelating agent is incorporated in the developer in use in an amount of from 0.01% to 5% by weight, preferably from 0.01% to 0.5% by weight.

[Alkaline Agent]

The developer to be used herein is an alkaline aqueous solution containing a nonionic compound represented by the general formula (III). Examples of the alkaline agent to be incorporated in the alkaline aqueous solution include inorganic alkaline agents such as sodium tertiary phosphate, potassium tertiary phosphate, ammonium tertiary phosphate, sodium carbonate, potassium carbonate, ammonium carbonate, sodium hydrogencarbonate, potassium hydrogencarbonate, ammonium hydrogencarbonate, sodium borate, potassium borate, ammonium borate, sodium hydroxide, potassium hydroxide, ammonium hydroxide and lithium hydroxide, and organic alkaline agents such as monomethylamine, dimethylamine, trimethylamine, monoethylamine, diethylamine, triethylamine, monoisopropylamine, diisopropylamine, triisopropylamine, n-butylamine, monoethanolamine, diethanolamine, triethanolamine, monoisopropanolamine, diisopropanolamine, ethylenimine, ethylenediamine, pyridine and tetramethylammonium hydroxide.

These alkaline agents maybe used singly or in combination of two or more thereof.

[Surface Active Agent]

The developer to be used herein may further comprise the following surface active agents incorporated therein besides the nonionic compound represented by the general formula (III).

Examples of the other surface active agents include nonionic surface active agents such as polyoxyethylene alkyl ether (e.g., polyoxyethylene lauryl ether, polyoxyethylene cetyl ether, polyoxyethylene stearyl ether), polyoxyethylene alkyl allyl ether (e.g., polyoxyethylene octyl phenyl ether, polyoxyethylene nonyl phenyl ether), polyoxyethylene alkyl ester (e.g., polyoxyethylene stearate), sorbitan alkyl ester (e.g., sorbitan monolaurate, sorbitan monostearate, sorbitan distearate, sorbitan monooleate, sorbitan sesquioleate, sorbitan trioleate) and monoglyceride alkyl ester (e.g., glycerol monostearate, glycerol monoleate), anionic surface active agents such as alkylbenzenesulfonate (e.g., sodium dodecylbenzenesulfonate), alkylnaphthalenesulfonate (e.g., sodium butylnaphthalenesulfonate, sodium pentylnaphthalenesulfonate, sodium hexylnaphthalenesulfonate, sodium octylnaphthalenesulfonate), alkylsulfate (e.g., sodium laurylsulfate), alkylsulfonate (e.g., sodium dodecylsulfonate) and sulfosuccinic acid ester (e.g., sodium dilaurylsulfosuccinate), and amphoteric surface active agents such as alkylbetaine (e.g., laurylbetaine, stearylbetaine). Particularly preferred among these surface active agents are anionic surface active agents such as alkylnaphthalene sulfonate.

These surface active agents may be used singly or in combination. The content of these surface active agents in the developer is preferably from 0.1% to 20% by weight as calculated in terms of effect component.

[Other Components]

The developer to be used herein may comprise the following components incorporated therein besides the aforementioned components as necessary. Examples of the other components include organic carboxylic acids such as benzoic acid, phthalic acid, p-ethylbenzoic acid, p-n-propylbenzoic acid, p-isopropylbenzoic acid, p-n-butylbenzoic acid, p-t-butylbenzoic acid, p-t-butylbenzoic acid, p-2-hydroxyethylbenzoic acid, decanic acid, salicyclic acid and 3-hydroxy-2-naphthoeic acid, organic solvents such as isopropyl alcohol, benzyl alcohol, ethyl cellosolve, butyl cellosolve, phenyl cellosolve, propylene glycol and diacetone alcohol, chelating agent, reducing agent, dye, pigment, water softener, and preservative.

In the plate-making process of the present invention, when development is effected using an automatic developing machine, the developer is fatigued according to the processed amount of the photosensitive lithographic printing plate. The processing capacity may be restored by the use of a developer replenisher or fresh developer.

The properties of the developer will be further described hereinafter.

[pH]

The developer to be used herein is an alkaline aqueous solution having a pH value of 12.5. The pH value of the developer is more preferably from 10.0 to 12.5, most preferably from 11.0 to 12.5 from the standpoint of development rate.

[Electrical Conductivity]

The electrical conductivity of the developer to be used herein is preferably not greater than 30 mS/cm. The electrical conductivity of the developer is more preferably from 3 to 30 mS/sec, most preferably from 3 to 15 mS/sec from the standpoint of development rate.

[Foamability]

30 ml of the developer is put in a 100 al transparent glass bottle having an inner diameter of 3 m. The glass bottle is then shaken vertically at a temperature of 25° C. three times per minute. The glass bottle is then allowed to stand. The time required until bubbles disappear (defoaming time) is then measured. The less the defoaming time is, the less is the foamability to advantage (high defoamability).

The developer of the present invention preferably has a low foamability and a defoaming time of not greater than 5 minutes and thus doesn't foam during development to impede the development step.

[Color]

The developer to be used herein is colorless, preferably colored to an extent such that it can be visually recognized for the purpose of preventing itself from being mistaken for water.

[Viscosity]

The developer to be used herein preferably exhibits a viscosity of from 1.0 to 10.0 cp at 25° C. when diluted with water to facilitate development.

EXAMPLE

The present invention will be further described in the following examples, but the present invention should not be construed as being limited thereto.

Example of Preparation of Support (Support 1: Preparation of Anodized Aluminum Support)

A 1s aluminum sheet having a thickness of 0.30 mm was grained with an aqueous suspension of 800-mesh pumice stone using a No. 8 nylon brush on the surface thereof, and was then thoroughly washed with water. The aluminum sheet thus grained was dipped in a 10% sodium hydroxide at a temperature of 70° C. for 60 seconds so that it was etched, washed with flowing water, neutralized and washed with a 20% $HNO_3$, and then washed with water. The aluminum sheet thus etched was then subjected to anodization in a 1% aqueous solution of nitric acid with a sinusoidal alternating current at a $V_A$ of 12.7 V and 300 coulomb/cm² so that it was roughened on the surface thereof. The aluminum sheet was then measured for surface roughness. The result was 0.45 μm as calculated in terms of Ra. Subsequently, the aluminum sheet was dipped in a 30% aqueous solution of $H_2SO_4$ at a temperature of 55° C. for 2 minutes so that it was desmutted, and then anodized at a temperature of 33° C. in a 20% aqueous solution of $H_2SO_4$ at a current density of 5 A/dm² for 50 seconds with a cathode provided on the grained surface thereof. The resulting anodized film had a density of 2.7 g/m². The aluminum sheet thus processed is hereinafter referred to as "Support 1".

(Preparation of Support 2)

To Support 1 thus prepared was then applied the following surface treatment undercoating liquid composition 1 in an amount such that the amount of P reached about 0.05 g/m². The coated support was then dried at a temperature of 100° C. to obtain Support 2.

<Undercoating Liquid Composition 1>

| Phenylphosphonic acid | 2 parts by weight |
| Methanol | 800 parts by weight |
| Water | 50 parts by weight |

(Preparation of Support 3)

To Support 1 was applied the following surface treatment undercoating liquid composition 2 in an amount such that the amount of Si reached about 0.001 g/m². The coated support was then dried at a temperature of 100° C. for 1 minute to obtain Support 3.

(Preparation of Support 4)

To Support 1 was applied a copolymer of a methyl methacrylate, ethyl acrylate and sodium 2-acrylamide-2-methlpropanesulfonate (molar ratio: 60/25/15; molecular weight: 30,000) in a water/methanol mixture (5 g/95 g) in an amount of 3 mg/m². The coated support was then dried at a temperature of 80° C. for 30 seconds to obtain Support 4.

(Undercoating Liquid Composition 2)

The following components were mixed with stirring. After 5 minutes, the mixture generated heat. The reaction mixture was then allowed to undergo reaction for 60 minutes. The content of the reaction vessel was then transferred to another vessel. To the reaction product was then added 30,000 parts by weight of methanol to obtain a liquid composition.

| Phosmer PE (produced by Uni-Chemical Co., Ltd.) | 20 parts by weight |
| Methanol | 130 parts by weight |
| Water | 20 parts by weight |
| Paratolluenesulfonic acid | 5 parts by weight |
| Tetraethoxysilane | 50 parts by weight |
| 3-Methacryloxypropyl triethoxy-silane | 50 parts by weight |

Example of Preparation of Photosensitive Material

To Supports 1 to 4 were applied photopolymerizable compositions having the following formulations in dried amounts set forth in Table 1, respectively. The coated supports were each then dried at a temperature of 90° C. to form a photosensitive layer thereon.

Subsequently, to the photosensitive layer was applied a 3 wt-% aqueous solution of a polyvinyl alcohol (saponification degree: 98 mol-%; polymerization degree 500) in a dried amount of 2.5 g/m². The coated amount was then semi-dried at a temperature of 100° C. for 1 minute to obtain a photosensitive lithographic printing plate (photosensitive material). (Photosensitive layer coating solution (photopolymerizable composition): described in detail in Table 1 below)

| | |
|---|---|
| Ethylenically unsaturated bond-containing compound (A) | a parts by weight |
| Linear organic high molecular polymer (B) | b parts by weight |
| Sensitizer (C) | 0.15 parts by weight |
| Photo-initiator (D) | 0.30 parts by weight |
| Additive (D) | 0.50 parts by weight |
| Fluorine-based surface active agent (Megafac F-177, produced by DAINIPPON INK & CHEMICALS, INC.) | 0.03 parts by weight |
| Heat polymerization inhibitor (N-nitrosohydroxylamine aluminum salt) | 0.01 parts by weight |
| ε-type copper phthalocyanine dispersion | 0.2 parts by weight |
| Methyl ethyl ketone | 30.0 parts by weight |
| Propylene glycol monomethyl ether | 30.0 parts by weight |

The ethylenically unsaturated bond-containing compound (A), the linear organic high molecular polymer (B), the sensitizer (C), the photo-initiator (D), and the additive (S) will be exemplified below.

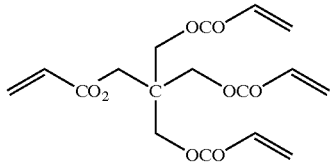

(A-1)

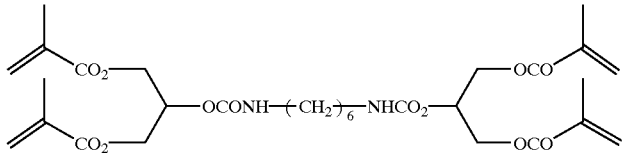

(A-2)

Mixture of:

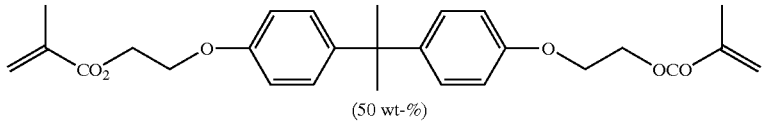

(50 wt-%)

and

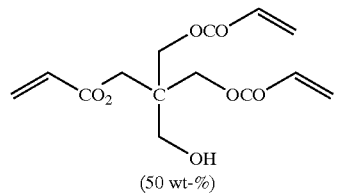

(50 wt-%)

(A-3)

Mixture of:
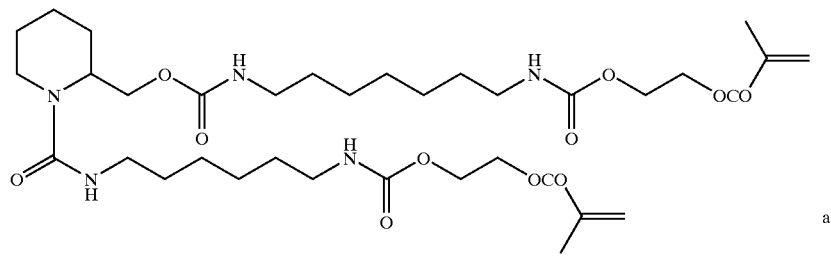
(50 wt-%)
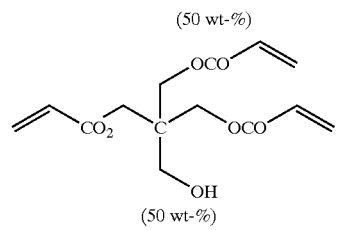
(50 wt-%)
(A-4)
and
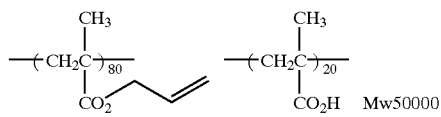 Mw50000
(B-1)
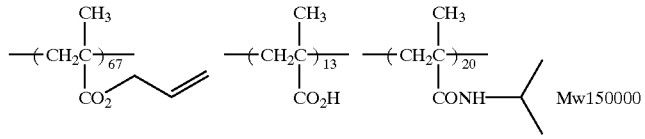 Mw150000
(B-2)
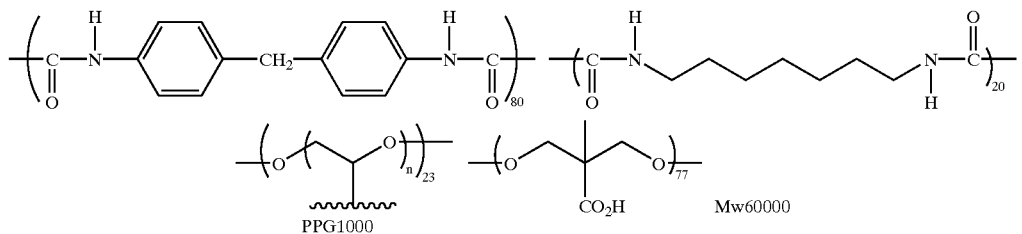 Mw60000
(B-3)
Co-Initiator (Additive)
(H1)
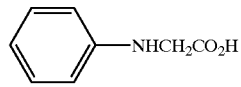
(H2)
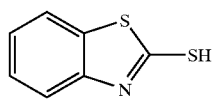
(H3)
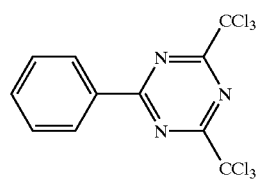
-continued
(H4)
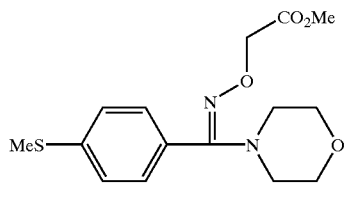
(H5)

-continued
(H6)
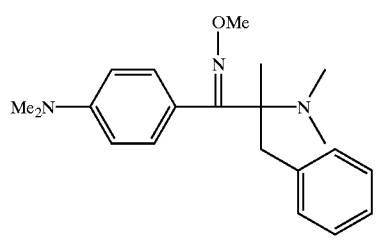
(H7)
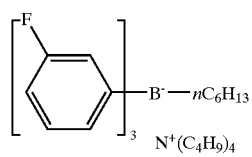
(H8)
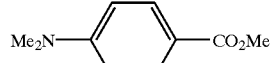
(H9)
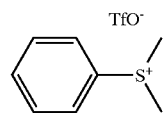
(H10)
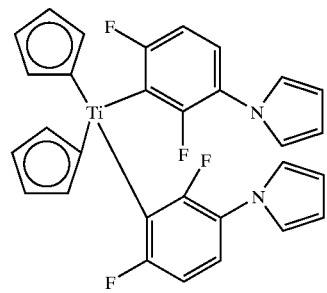
Initiator
(I-1)
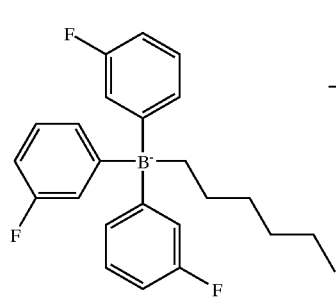
(I-2)
-continued
(I-3)
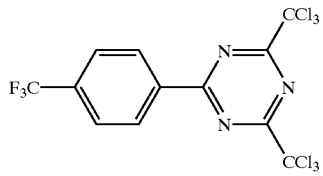
(I-4)
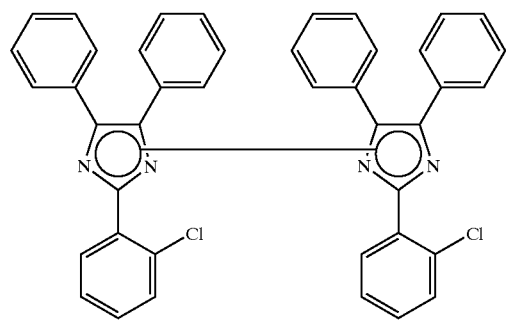
(I-5)
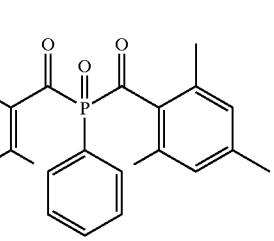
Comparative Dye
(DR-1)
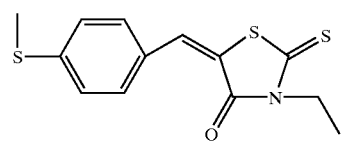
(DR-2)
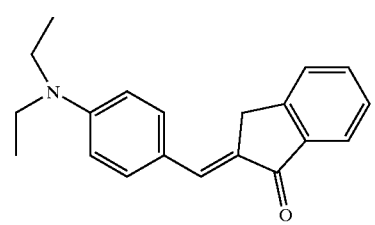
(DR-3)
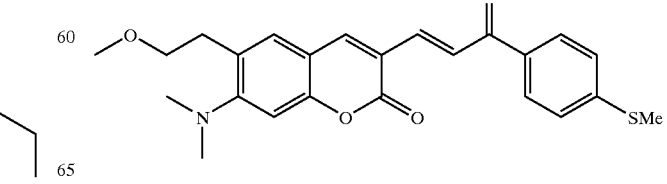
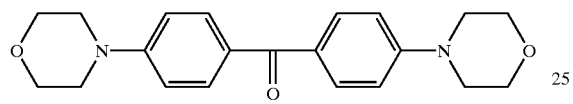
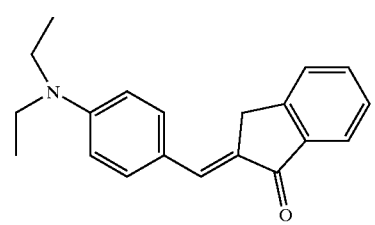

TABLE 1

| | A | a parts by weight | B | b parts by weight | Initiator | Sensitizing dye | Additive | Support | Acid value of photosensitive layer | Coated amount (mg/m$^2$) |
|---|---|---|---|---|---|---|---|---|---|---|
| (example of present inventive) | | | | | | | | | | |
| Photosensitive material 1 | A1 | 1.7 | B1 | 1.9 | I-1 | D-1 | H2 | 1 | 0.45 | 1.0 |
| Photosensitive material 6 | A4 | 1.7 | B2 | 1.9 | I-1 | D-11 | H5 | 2 | 0.46 | 1.5 |
| Photosensitive material 11 | A3 | 1.7 | B2 | 1.9 | I-1 | D-17 | H3 | 4 | 0.45 | 0.9 |
| Photosensitive material 16 | A4 | 1.8 | B2 | 2.2 | I-1 | D-26 | H9 | 1 | 0.42 | 1.2 |
| Photosensitive material 21 | A2 | 1.9 | B1 | 1.8 | I-1 | D-40 | H1 | 1 | 0.44 | 1.2 |
| Photosensitive material 2 | A1 | 1.7 | B2 | 1.9 | I-2 | D-2 | H4 | 2 | 0.42 | 1.2 |
| Photosensitive material 7 | A2 | 2.3 | B3 | 2.0 | I-2 | D-12 | H8 | 3 | 0.48 | 1.4 |
| Photosensitive material 12 | A4 | 1.7 | B2 | 1.9 | I-2 | D-18 | H10 | 2 | 0.46 | 1.5 |
| Photosensitive material 17 | A1 | 1.7 | B1 | 1.9 | I-2 | D-25 | H2 | 1 | 0.45 | 1.0 |
| Photosensitive material 22 | A3 | 1.6 | B2 | 3.3 | I-2 | D-41 | H10 | 3 | 0.48 | 1.5 |
| Photosensitive material 3 | A1 | 1.5 | B1 | 2.0 | I-3 | D-3 | H1 | 3 | 0.71 | 1.2 |
| Photosensitive material 8 | A1 | 1.7 | B2 | 1.9 | I-3 | D-13 | H6 | 2 | 0.43 | 1.7 |
| Photosensitive material 13 | A2 | 1.3 | B1 | 1.5 | I-3 | D-14 | H7 | 2 | 0.34 | 1.6 |
| Photosensitive material 18 | A1 | 1.3 | B2 | 1.8 | I-3 | D-29 | H7 | 4 | 0.39 | 2.2 |
| Photosensitive material 23 | A4 | 1.7 | B1 | 2.5 | I-3 | D-33 | H1 | 2 | 0.46 | 3.1 |
| Photosensitive material 4 | A1 | 1.7 | B2 | 1.9 | I-4 | D-6 | H2 | 2 | 0.46 | 1.7 |
| Photosensitive material 9 | A2 | 1.7 | B2 | 1.9 | I-4 | D-4 | H4 | 1 | 0.43 | 1.5 |
| Photosensitive material 14 | A1 | 1.3 | B2 | 1.9 | I-4 | D-20 | H7 | 1 | 0.36 | 1.8 |
| Photosensitive material 19 | A3 | 1.8 | B3 | 2.2 | I-4 | D-30 | H2 | 4 | 0.55 | 1.5 |
| Photosensitive material 24 | A3 | 1.7 | B3 | 1.9 | I-4 | D-39 | H10 | 1 | 0.37 | 1.4 |
| Photosensitive material 5 | A3 | 1.7 | B2 | 1.9 | I-5 | D-7 | H2 | 4 | 0.45 | 0.9 |
| Photosensitive material 10 | A1 | 1.7 | B2 | 1.9 | I-5 | D-15 | H7 | 2 | 0.46 | 1.3 |
| Photosensitive material 15 | A3 | 1.3 | B3 | 1.6 | I-5 | D-21 | H9 | 3 | 0.35 | 1.0 |
| Photosensitive material 20 | A3 | 2.2 | B2 | 2.6 | I-5 | D-32 | H4 | 2 | 0.38 | 1.4 |
| Photosensitive material 25 | A2 | 1.7 | B2 | 1.6 | I-5 | D-42 | H9 | 1 | 0.43 | 1.5 |
| (Comparative example) | | | | | | | | | | |
| Photosensitive material A | A1 | 1.7 | B1 | 1.9 | I-1 | None | H2 | 1 | 0.45 | 1.0 |
| Photosensitive material B | A1 | 1.7 | B1 | 1.9 | I-2 | DR-1 | H2 | 1 | 0.45 | 1.0 |
| Photosensitive material C | A2 | 1.7 | B2 | 1.9 | I-4 | DR-2 | H4 | 1 | 0.43 | 1.5 |
| Photosensitive material D*) | A4 | 1.7 | B2 | 1.9 | I-1 | DR-3 | H5 | 2 | 0.45 | 1.5 |

*)For the photosensitive material D, FD-YAG laser (532 nm) was used as an exposing light source.

The value of acid value of photosensitive layer set forth in the table above is a measured value obtained by calculating from the measurements of the amount of acid contained in g of photosensitive layer by titration with sodium hydroxide.

Example of Developer

The developer having the following formulation was prepared.

Example: Developers 1 to 20: Described in Detail in Table 2 Below

| Alkali | (X) | x g |
|---|---|---|
| Compound of the general formula (I) | (Y) | 5.0 g |
| Chelating agent | (Z) | 0.1 g |
| Additive 1 | (P) | 1.0 g |
| Additive 2 | (Q) | 1.0 g |
| Water |  | (92.9 − x) g |

The chelating agent (Z), the additive 1 (P) and the additive 2 (Q) to be incorporated in the developer will be exemplified below.
(Z-1) Tetrasodium ethylenediaminetetraacetate
(Z-2) Citric acid
(Z-3) Tripotassium hydroxyethylethylenediaminetriacetate
(P-1)

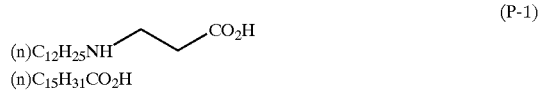

(P-3)

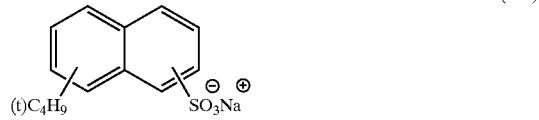

(P-4)

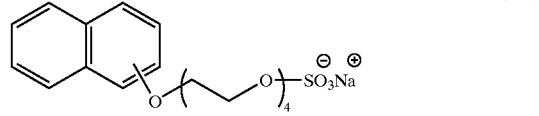

(Q-1)

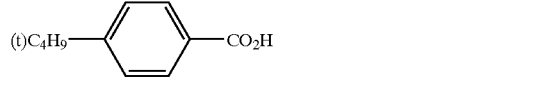

(Q-2)

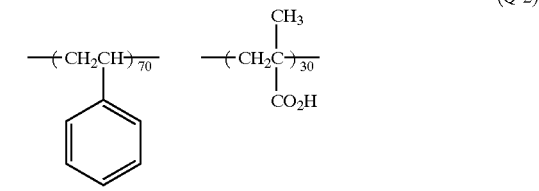

(Weight-average molecular weight: 20,000)

(Q-3)

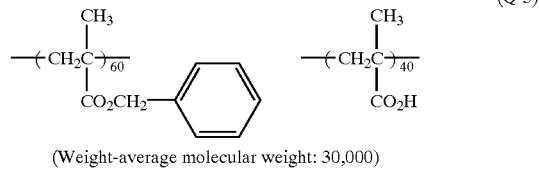

(Weight-average molecular weight: 30,000)

TABLE 2

| X (x g) | Y | Z | P | Q |
|---|---|---|---|---|
| Inventive Example: | | | | |
| Developer 1 NaOH (0.15 g) | Y-1 | Z-1 | None | None |
| Developer 2 NaOH (0.15 g) | Y-1 | Z-1 | None | None |
| Developer 3 NaOH (0.20 g) | Y-1 | Z-1 | P-1 | Q-1 |
| Developer 4 NaOH (0.15 g), monoethanolamine (1.35 g) | Y-1 | Z-1 | None | None |
| Developer 5 NaOH (0.15 g), triethanolamine (1.35 g) | Y-1 | Z-1 | None | None |
| Developer 6 NaOH (0.15 g) | Y-1 | None | None | None |
| Developer 7 NaOH (0.15 g) | Y-4 | Z-1 | None | None |
| Developer 8 NaOH (0.15 g) | Y-6 | Z-1 | None | None |
| Developer 9 NaOH (0.15 g) | Y-7 | Z-1 | None | None |
| Developer 10 NaOH (0.15 g) | Y-10 | Z-1 | None | None |
| Developer 11 NaOH (0.15 g) | Y-13 | Z-1 | None | None |
| Developer 12 NaOH (0.15 g) | Y-17 | Z-1 | None | None |
| Developer 13 NaOH (0.15 g) | Y-21 | Z-1 | None | None |
| Developer 14 NaOH (0.15 g) | Y-1 | Z-2 | None | None |
| Developer 15 NaOH (0.15 g) | Y-1 | Z-3 | None | None |
| Developer 16 NaOH (0.15 g) | Y-1 | Z-1 | P-2 | None |
| Developer 17 NaOH (0.15 g) | Y-1 | Z-1 | P-3 | None |
| Developer 18 NaOH (0.15 g) | Y-1 | Z-1 | P-4 | None |
| Developer 19 NaOH (0.15 g) | Y-1 | Z-1 | P-2 | Q-2 |
| Developer 20 NaOH (0.15 g) | Y-1 | Z-1 | P-2 | Q-3 |
| Comparative Example: | | | | |
| Developer 1 KOH (0.15 g) | None | None | None | None |
| Developer 2 KOH (0.15 g) | None | Z-1 | None | None |
| Developer 3 KOH (2.0 g) | Y-1 | Z-1 | None | None |
| Developer 4: | Silicate-based LP-D developer, produced by Fuji Photo Film Co., Ltd., diluted with water by a factor of 10 | | | |
| Developer 5: | Organic alkali-based DN-3C developer, produced by Fuji Photo Film Co., Ltd., diluted with water by a factor of 5 | | | |

[Test on Properties of Developer]

The results of measurement of the physical properties of the developers of Table 2 above according to the various examination methods defined herein are set forth in Table 3 below.

TABLE 3

|  | pH | Electrical conductivity (mS/cm) |
|---|---|---|
| Inventive Example: | | |
| Developer 2 | 11.5 | 5 |
| Developer 3 | 12.3 | 8 |
| Developer 5 | 11.9 | 6 |
| Developer 6 | 11.8 | 4 |
| Developer 7 | 11.5 | 5 |
| Developer 16 | 11.8 | 6 |
| Comparative Example: | | |
| Developer 1 | 11.6 | 5 |
| Developer 2 | 11.5 | 5 |
| Developer 3 | 12.8 | 25 |
| Developer 4 | 12.8 | 32 |
| Developer 5 | 10.0 | 7 |

[Evaluation of Printability, etc.]

The results of examination of combination of the photosensitive materials set forth in Table 1 and developers set forth in Table 2 are set forth in Table 4 below.

The exposure, printing and development were effected under the following conditions.

(Evaluation of Sensitivity)

The aforementioned coated photosensitive material was exposed to light beam from a 405 nm semiconductor laser in the atmosphere, and then dipped in the respective developer corresponding to the various examples set forth in Table 4 below at 25° C. for 10 seconds to undergo development. The sensitivity was then calculated at a unit of mj /cm$^2$ from the minimum exposure at which an image can be formed.

(Evaluation of Flare Fog)

The aforementioned coated photosensitive material was subjected to scanning exposure to light having a wavelength of 405 nm from a 30 mW violet LD (inner drum type experiment machine) through the following image at an exposure of 100 µ/cm$^2$ (standard exposure) and 4,000 dpi and 175 lines/inch.

Image: 100% image intensity (solid) on half area, non-image area on the other half. 50% Halftone image is formed on the central part of the two half areas.

The photosensitive material which had been exposed was subjected to standard processing in an automatic developing machine (LP-850P2, produced by Fuji Photo Film Co., Ltd.) loaded with various developers and a finishing gum solution FP-2W (produced by Fuji Photo Film Co., Ltd.), and then measured for two 50% halftone densities. At the solid area, the photosensitive material is much exposed around the 50% halftone image and thus is much subject to effect of flare light. In other words, the solid area tends to have a greater 50% halftone density than at the non-image area.

In order to determine the effect of flare light, the value obtained by subtracting 50% halftone density at non-image area from 50% halftone density at solid area is defined as flare fog (%). The lithographic printing plate was then measured for flare fog. The smaller this value is, the smaller is the effect of flare. Such a lithographic printing plate is desirable.

(Evaluation of Development Tailings)

20m$^2$ of the aforementioned coated photosensitive material was subjected to development in the aforementioned developer (1 1) while being rubbed with a sponge. The developer thus used was allowed to stand for 1 month, and then examined for the presence of development tailings. Those showing no development tailings were evaluated as good. Those showing development in a small amount were evaluated as fair. The results of this test are set forth in Table 4 below.

TABLE 4

|  | Photosensitive material | Developer | Sensitivity mJ/cm$^2$ | Flare fog | Development tailings |
|---|---|---|---|---|---|
| Example 1 | Photosensitive material 1 | Developer 1 | 0.21 | 1 | G |
| Example 2 | Photosensitive material 2 | Developer 2 | 0.15 | 0 | G |
| Example 3 | Photosensitive material 3 | Developer 3 | 0.2 | 1 | G |
| Example 4 | Photosensitive material 4 | Developer 4 | 0.15 | 0 | G |
| Example 5 | Photosensitive material 5 | Developer 5 | 0.17 | 0 | G |
| Example 6 | Photosensitive material 6 | Developer 6 | 0.13 | 1 | G |
| Example 7 | Photosensitive material 7 | Developer 7 | 0.16 | 2 | G |
| Example 8 | Photosensitive material 8 | Developer 8 | 0.22 | 0 | G |
| Example 9 | Photosensitive material 9 | Developer 9 | 0.31 | 0 | G |
| Example 10 | Photosensitive material 10 | Developer 10 | 0.22 | 2 | G |
| Example 11 | Photosensitive material 11 | Developer 11 | 0.4 | 1 | G |
| Example 12 | Photosensitive material 12 | Developer 12 | 0.36 | 0 | G |
| Example 13 | Photosensitive material 13 | Developer 13 | 0.36 | 0 | G |
| Example 14 | Photosensitive material 14 | Developer 14 | 0.33 | 2 | G |
| Example 15 | Photosensitive material 15 | Developer 15 | 0.24 | 0 | G |
| Example 16 | Photosensitive material 16 | Developer 16 | 0.48 | 1 | G |
| Example 17 | Photosensitive material 17 | Developer 17 | 0.42 | 0 | G |
| Example 18 | Photosensitive material 18 | Developer 18 | 0.45 | 0 | G |
| Example 19 | Photosensitive material 19 | Developer 19 | 0.4 | 2 | G |
| Example 20 | Photosensitive material 20 | Developer 20 | 0.39 | 1 | G |
| Example 21 | Photosensitive material 21 | Developer 7 | 0.33 | 0 | G |
| Example 22 | Photosensitive material 22 | Developer 4 | 0.39 | 0 | G |
| Example 23 | Photosensitive material 23 | Davaloper 15 | 0.4 | 1 | G |
| Example 24 | Photosensitive material 24 | Developer 16 | 0.28 | 0 | G |
| Example 25 | Photosensitive material 25 | Developer 9 | 0.37 | 2 | G |

TABLE 4-continued

|  | Photosensitive material | Developer | Sensitivity mJ/cm² | Flare fog | Development tailings |
|---|---|---|---|---|---|
| Example 26 | Photosensitive material 2 | Comparison 1 | 0.35 | 3 | F |
| Example 27 | Photosensitive material 8 | Comparison 2 | 0.38 | 2 | F |
| Enample 28 | Photosensitive material 6 | Comparison 3 | 0.39 | 3 | F |
| Example 29 | Photosensitive material 10 | Comparison 4 | 0.27 | 2 | F |
| Comparative Example 1 | Photosensitive material A | Developer 1 | 10.0 | 2 | G |
| Comparative Example 2 | Photosensitive material B | Developer 2 | 1.9 | 1 | G |
| Comparative Example 3 | Photosensitive material C | Developer 3 | 2.2 | 1 | G |
| Comparative Example 4 | Photosensitive material D | Developer 10 | 0.66 | 0 | G |
| Comparative Example 5 | Photosensitive material 14 | Comparison 5 | Left unremoved film | Left unremoved film | F |

As can be seen in Table 4, the developer of the present invention exhibits good developing properties and attains desired sensitivity and print stain resistance at the same time. Further, the developer of the present invention gives no development tailings, providing a good development stability.

Examination of Development Behavior

The results of examination of development behavior of the examples and comparative examples set forth in Table 4 according to the method defined herein are set forth in Table 5 below.

TABLE 5

|  | Photosensitive material | Developer | Development rate at unexposed area ($\mu$m/s) | Developer penetration rate at exposed area ($\mu$m/s) | Dissolution behavior (presence of interference wave) |
|---|---|---|---|---|---|
| Example 2 | 2 | 2 | 0.2 | 0.005 | Observed |
| Comparative Example 1 | 2 | Comparative 1 | 0.005 | 0.005 | None |
| Comparative Example 2 | 2 | Comparative 2 | 0.005 | 0.005 | None |
| Comparative Example 3 | 2 | Comparative 3 | 0.01 | 0.15 | None |
| Comparative Example 4 | 2 | Comparative 4 | 0.01 | 0.15 | None |
| Comparative Example 5 | 2 | Comparative 5 | 0.05 | 0.2 | None |

When a specific sensitizing dye-containing photosensitive lithographic printing plate is subjected to development with a specific developer to prepare a printing plate according to the present invention, a very hard image with little print stain due to optical fog can be obtained. Further, the remarkable reduction of development tailings makes it possible to enhance development stability.

The entitle disclosure of each and every foreign patent application from which the benefit of foreign priority has been claimed in the present application is incorporated herein by reference, as if fully set forth herein.

While the present invention has been described in detail and with reference to specific embodiments thereof, it will be apparent to one skilled in the art that various changes and modifications can be made therein without departing from the spirit and scope thereof.

What is claimed is:

1. A photopolymerization process which comprises exposing a photosensitive lithographic printing plate containing at least one of sensitizing dyes represented by the following general formula (I) to laser beam having a wavelength of not greater than 450 nm:

$$\text{(I)}$$

wherein T represents OR, SR, N(R)$_2$ or SO$_2$R and at least one T is present in the ortho or para position of the vinyl group, with the proviso that when the site at which Y is connected to the phenyl ring is an oxygen atom, sulfur atom or nitrogen atom, T may not be present; X represents an oxygen atom, sulfur atom or NR; Y represents a nonmetallic atom group which forms a ring with the adjacent carbon atoms; and R's each represent a hydrogen atom or nonmetallic atom group and may be connected to each other; and then developing the photosensitive lithographic printing plate thus exposed with a non-silicate-based developer containing a nonionic compound represented by the following general formula (III):

A-W    (III)

wherein A represents a hydrophobic organic group log P of which is not smaller than 1.5 as determined in the form of A-H; and W represents a nonionic hydrophilic organic group log P of which falls below 1.0 as determined in the form of W-H.

2. The plate-making process for the production of a lithographic printing plate as in claim 1, wherein the developer contains a chelating agent for divalent metal.

3. The plate-making process for the production of a lithographic printing plate as in claim 1, wherein the developer exhibits a pH value of from 10.0 to 12.5 and an electrical conductivity of from 3 to 30 mS/cm.

4. A photopolymerization process which comprises exposing a photosensitive lithographic printing plate containing at least one of sensitizing dyes represented by the following general formula (II) to laser beam having a wavelength of not greater than 450 nm:

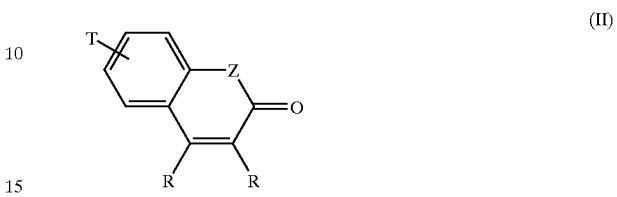

(II)

wherein T represents OR, SR, N(R)$_2$ or SO$_2$R and at least one T is present in the ortho or para position of the vinyl group R's each represent a hydrogen atom or nonmetallic atom group and may be connected to each other; and Z represents NR.

* * * * *